US012598947B2

(12) United States Patent
Amahisa et al.

(10) Patent No.: US 12,598,947 B2
(45) Date of Patent: Apr. 7, 2026

(54) SUBSTRATE TREATING APPARATUS

(71) Applicant: SCREEN Holdings Co., Ltd., Kyoto (JP)

(72) Inventors: Kenji Amahisa, Kyoto (JP); Shinichi Taniguchi, Kyoto (JP); Akihiro Iwasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 324 days.

(21) Appl. No.: 18/472,922

(22) Filed: Sep. 22, 2023

(65) Prior Publication Data

US 2024/0105486 A1 Mar. 28, 2024

(30) Foreign Application Priority Data

Sep. 26, 2022 (JP) ................................. 2022-152835

(51) Int. Cl.
*H10P 72/30* (2026.01)
*H10P 72/00* (2026.01)

(52) U.S. Cl.
CPC ...... *H10P 72/3412* (2026.01); *H10P 72/0416* (2026.01); *H10P 72/3211* (2026.01); *H10P 72/3222* (2026.01)

(58) Field of Classification Search
CPC .................... H01L 21/67781; H01L 21/67718
See application file for complete search history.

(56) References Cited

U.S. PATENT DOCUMENTS 5,788,447 A * 8/1998 Yonemitsu ........ H01L 21/67173
414/217
2003/0091410 A1* 5/2003 Larson .............. H01L 21/67161
414/217

(Continued)

FOREIGN PATENT DOCUMENTS

DE 102007061410 A1 6/2009
JP S57-154854 A 9/1982

(Continued)

OTHER PUBLICATIONS

Extended European Search Report dated Mar. 1, 2024 for corresponding European Patent Application No. 23198871.8.

(Continued)

*Primary Examiner* — Jonathan Snelting
(74) *Attorney, Agent, or Firm* — OSTROLENK FABER LLP

(57) ABSTRACT

Disclosed is a substrate treating apparatus provided with a treating block. The treating block includes a wet transportation region adjoining a batch treatment region and a single-wafer transportation region. The wet transportation region contains a second posture turning mechanism provided on an extension line of a line of six batch process tanks and configured to turn a posture of substrates, on which immersion treatment is performed, from vertical to horizontal, a belt conveyor mechanism configured to receive the substrates in a horizontal posture one by one from the second posture turning mechanism and transport the substrates to the single-wafer transportation region, and a liquid supplying unit configured to supply a liquid to wet the substrates, transported by the belt conveyor mechanism, with the liquid.

8 Claims, 16 Drawing Sheets

(56) References Cited

U.S. PATENT DOCUMENTS

| | | | |
|---|---|---|---|
| 2005/0063799 A1* | 3/2005 | Larson .............. | H01L 21/67161 |
| | | | 414/217 |
| 2006/0137726 A1 | 6/2006 | Sano et al. ...................... | 134/61 |
| 2010/0068014 A1 | 3/2010 | Mitsuyoshi et al. ..... | 414/225.01 |
| 2011/0008145 A1 | 1/2011 | Huber ........................ | 414/795.5 |
| 2015/0332940 A1 | 11/2015 | Wang et al. | |
| 2018/0090360 A1 | 3/2018 | Miyamoto | |
| 2021/0082720 A1 | 3/2021 | Kikumoto et al. | |
| 2021/0111038 A1 | 4/2021 | Kanagawa et al. | |
| 2022/0172966 A1 | 6/2022 | Choi et al. | |

FOREIGN PATENT DOCUMENTS

| | | |
|---|---|---|
| JP | S60-110328 A | 6/1985 |
| JP | S63-182834 A | 7/1988 |
| JP | H03-006581 Y2 | 2/1991 |
| JP | 2006-179757 A | 7/2006 |
| JP | 2006-261546 A | 9/2006 |
| JP | 2006-261547 A | 9/2006 |
| JP | 2010-067871 A | 3/2010 |
| JP | 2016-502275 A | 1/2016 |
| JP | 2018-056338 A | 4/2018 |
| JP | 2021-064652 A | 4/2021 |
| JP | 2022-057884 A | 4/2022 |
| JP | 2022-087065 A | 6/2022 |
| KR | 10-2006-0002266 A | 1/2006 |
| KR | 10-2021-0058209 A | 5/2021 |

OTHER PUBLICATIONS

Notice of Allowance dated Feb. 3, 2026 for corresponding Japanese Patent Application No. 2022-152835 and its machine translation.

* cited by examiner

SUBSTRATE TREATING APPARATUS

CROSS-REFERENCE TO RELATED APPLICATIONS

This application claims priority to Japanese Patent Application No. 2022-152835 filed Sep. 26, 2022, the subject matter of which is incorporated herein by reference in entirety.

TECHNICAL FIELD

The present invention relates to a substrate treating apparatus configured to perform treatment on substrates. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

BACKGROUND ART

Examples of currently-used substrate treating apparatus include a substrate treating apparatus of a hybrid type provided with a batch-type processing module (batch processing unit) configured to perform treatment on a plurality of substrates collectively, and a single-wafer-type processing module (single-wafer processing unit) configured to perform treatment on the substrates treated by the batch-type processing module one by one. See, for example, Japanese Patent Publication (Translation of PCT Application) No. 2016-502275 and Japanese Unexamined Patent Publication No. 2021-064652. A posture of the substrates treated in the batch-type processing module is turned to horizontal, and then are transported to the single-wafer-type processing module one by one by a transport robot.

Japanese Unexamined Utility Model (Registration) Publication No. H03-006581 discloses an in-liquid loader provided with a liquid tank, an arm configured to place a cassette (carrier) thereon, the cassette accommodating a large number of thin plates, a lifting and lowering device configured to move the arm upward and downward, and a pusher (pushing member) configured to push the thin plates from the cassette to a conveyor. The in-liquid loader puts the cassette, placed on the arm, into a liquid. When the thin plates are used, the in-liquid loader pulls out an upper part of the thin plates one by one above the liquid level, and the thin plates above the liquid level are pushed out to the conveyor. The pushed-out thin plates are fed to a next treating device.

SUMMARY OF INVENTION

Technical Problem

However, the currently-used substrate treating apparatus possess the following drawback. The substrates treated in the batch-type processing module have to be transported from a batch treatment region where the batch-type processing module is provided to a single-wafer treatment region where the single-wafer-type processing module is provided. If the substrates are dried during such transport as above, patterns formed on the substrates collapse.

The present invention has been made regarding the state of the art noted above, and its object is to provide a substrate treating apparatus that can prevent drying of substrates while the substrates are transported from a batch treatment region to a single-wafer treatment region.

Solution to Problem

The present invention is constituted as stated below to achieve the above object. One aspect of the present invention provides a substrate treating apparatus for successively performing batch treatment for processing a plurality of substrates collectively and single-wafer treatment for processing the substrates one by one. The substrate treating apparatus includes a carrier mount shelf configured to place a carrier thereon, the carrier accommodating a plurality of substrates in a horizontal posture vertically at a predetermined gap, a transferring block adjoining the carrier mount shelf, and a treating block adjoining the transferring block, the transferring block includes a first posture turning mechanism configured to turn a posture of the substrates, taken out of the carrier, from horizontal to vertical, and a substrate handling mechanism configured to take out the substrates collectively from the carrier placed on the carrier mount shelf to transport the substrates to the first posture turning mechanism, and configured to return the substrates, on which the single-wafer treatment is performed, to the carrier placed on the carrier mount shelf. The treating block contains a batch treatment region extending in a direction apart from the transferring block, a batch substrate transportation region which is provided along the batch treatment region, whose first end extends to the transferring block, and whose second end extends in a direction apart from the transferring block, a single-wafer transportation region extending in a direction apart from the transferring block, a single-wafer treatment region provided along the single-wafer transportation region, and a wet transportation region adjoining the batch treatment region and the single-wafer transportation region, The batch treatment region contains a plurality of batch process tanks configured to perform immersion treatment on the substrates collectively and arranged in a direction where the batch treatment region extends, the wet transportation region contains a second posture turning mechanism provided on an extension line of a line of the batch process tanks and configured to turn a posture of the substrates, on which the immersion treatment is performed, from vertical to horizontal, a belt conveyor mechanism configured to receive the substrates in a horizontal posture one by one from the second posture turning mechanism and transport the substrates to the single-wafer transportation region, and a liquid supplying unit configured to supply a liquid to wet the substrates, transported by the belt conveyor mechanism, with the liquid. The single-wafer treatment region contains a plurality of single-wafer processing chambers, configured to perform treatment on the substrates one by one, arranged in a direction where the single-wafer treatment region extends, the single-wafer transportation region contains a single-wafer substrate transport mechanism that can receive the substrates in the horizontal posture, transported by the belt conveyor mechanism and transport the substrates to the single-wafer processing chamber, and can unload the substrates on which the treatment is performed in the single-wafer processing chamber, and the batch substrate transportation region contains a batch substrate transport mechanism configured to transport the substrates collectively among a substrate delivery position defined in the transferring block, the batch process tanks, and the second posture turning mechanism.

With the substrate treating apparatus according to the aspect of the present invention, the wet transportation region adjoins the batch treatment region and the single-wafer transportation region. The wet transportation region contains the second posture turning mechanism, the belt conveyor mechanism, and the liquid supplying unit. The second posture turning mechanism is provided on the extension line of the line of the batch process tanks, and turns a posture of the substrates, on which the immersion treatment is performed, from vertical to horizontal. The belt conveyor mechanism receives the substrates in the horizontal posture one by one from the second posture turning mechanism, and transports the substrates to the single-wafer transportation region. The liquid supplying unit supplies a liquid for wetting the substrates transported by the belt conveyor mechanism. The belt conveyor mechanism transports the substrates, wetted by the liquid supplying unit, from the second posture turning mechanism toward the single-wafer transportation region. The single-wafer substrate transport mechanism in the single-wafer transportation region receives the substrates in the horizontal posture, transported by the belt conveyor mechanism, transports the substrates to the single-wafer processing chamber. Accordingly, drying the substrates can be prevented while the substrates are transported from the batch treatment region to the single-wafer treatment region.

Moreover, the belt conveyor mechanism transports the substrates even when the single-wafer transportation region is apart from the batch treatment region, and thus the single-wafer substrate transport mechanism can easily receive the substrates. In addition, the belt conveyor mechanism and the liquid supplying unit can prevent drying of the substrates. This results in a long transportation path, achieving enhanced flexibility in arrangement of the batch treatment region and the single-wafer treatment region.

Moreover, it is preferred in the substrate treating apparatus described above that the single-wafer transportation region is provided between the batch treatment region and the single-wafer treatment region. Accordingly, the transferring block, the batch treatment region, and the single-wafer treatment region can be arranged around the single-wafer transportation region as the center.

Moreover, it is preferred in the substrate treating apparatus described above that the single-wafer treatment region contains a first single-wafer processing chamber and a second single-wafer processing chamber as the plurality of single-wafer processing chambers and further contains a second single-wafer substrate transport mechanism configured to transport the substrates between the both chambers, and that the single-wafer substrate transport mechanism receives the substrates in the horizontal posture, transported by the belt conveyor mechanism, to transport the substrates to the first single-wafer processing chamber, and unloads the substrates on which the treatment is performed in the second single-wafer processing chamber. Accordingly, the substrates are transported by the two single-wafer substrate transport mechanisms, achieving enhanced throughput.

Moreover, it is preferred in the substrate treating apparatus described above that the single-wafer treatment region is provided between the batch treatment region and the single-wafer transportation region. Accordingly, a region opposite to the single-wafer treatment region across the single-wafer transportation region is usable as the second single-wafer treatment region, achieving arrangement of many single-wafer processing chambers.

Moreover, it is preferred in the substrate treating apparatus described above that the wet transportation region is provided on a first end of the batch treatment region opposite to the transferring block, and that, when the substrates cannot be transported linearly from the second posture turning mechanism to the single-wafer transportation region because the single-wafer treatment region is interposed, the belt conveyor mechanism is provided so as to avoid the single-wafer treatment region in plan view. Since the belt conveyor mechanism can transport the substrates while avoiding an obstacle, achieving enhanced flexibility in arrangement of the single-wafer treatment region and the like.

Moreover, it is preferred in the substrate treating apparatus described above that the wet transportation region is provided between the transferring block and the batch treatment region. Accordingly, the wet transportation region is arranged adjacent to the transferring block. As a result, the single-wafer substrate transport mechanism can transport the substrates starting from a side adjacent to the transferring block. In addition, since a chemical liquid process tank can be positioned apart from the transferring block, achieving suppression of adverse effects like corrosion of mechanisms, like the substrate handling mechanism of the transferring block, by chemical atmosphere.

Moreover, it is preferred in the substrate treating apparatus described above that the single-wafer treatment region contains a first single-wafer processing chamber and a second single-wafer processing chamber as the plurality of single-wafer processing chambers and further contains a second single-wafer transportation region between the both chambers, and that the wet transportation region is provide on a first end of the batch treatment region opposite to the transferring block, the single-wafer transportation region contains a transferring block-side transportation region adjacent to the transferring block and a belt conveyor-side transportation region adjacent to the belt conveyor mechanism, the second single-wafer transportation region and the belt conveyor-side transportation region contain a second single-wafer substrate transport mechanism configured to receive the substrates in the horizontal posture, transported by the belt conveyor mechanism, to transport the substrates to the first single-wafer processing chamber, and transport the substrates, on which a treatment is performed in the first single-wafer processing chamber, to the second single-wafer processing chamber, and the single-wafer substrate transport mechanism unloads the substrates on which a treatment is performed in the second single-wafer processing chamber.

Accordingly, the single-wafer substrate transport mechanism can transport only the dried substrates, and the second single-wafer substrate transport mechanism can transport only the wet substrates.

Moreover, it is preferred in the substrate treating apparatus described above that the second posture turning mechanism includes an in-tank carrier having a passage through which the substrates are loaded and unloaded, two side walls including plural-paired holding grooves for housing the substrates having passed through the passage, the holding grooves being provided such that grooves in each pair face each other, and a rear opening which is provided so as to face the passage across the substrates and whose width is smaller than a diameter of each of the substrates in a radial direction, an immersion tank configured to store an immersion liquid for immersing the in-tank carrier in the immersion liquid, a carrier supporting portion configured to support the in-tank carrier from below, a carrier lifting and lowering portion configured to move the carrier supporting portion upward and downward, a rotating mechanism configured to rotate the in-tank carrier around two rotation shafts extending in a horizontal direction while gripping the two side walls of the in-tank carrier with the two rotation shafts in order to turn a posture of the substrates from vertical to horizontal, a pushing member configured to push out one substrate accommodated in the in-tank carrier, and a pushing member advancing and withdrawing portion configured to move the pushing member forward and rearward in a horizontal direction, and that when the substrates accommodated in the in-tank carrier are in the horizontal posture, the pushing member advancing and withdrawing portion pushes out the one substrate through the passage while moving the pushing member forward from the rear opening into the in-tank carrier.

The second posture turning mechanism includes the immersion tank where the in-tank carrier can be immersed in the immersion liquid. This can prevent drying of the substrates accommodated in the in-tank carrier. Moreover, the pushing member advancing and withdrawing portion can push out the substrates, accommodated in the in-tank carrier, with the pushing member. Accordingly, the substrates can be taken out of the in-tank carrier without moving a hand of the single-wafer substrate transport mechanism forward.

Advantageous Effects of Invention

With the substrate treating apparatus according to the aspect of the present invention, drying of the substrates can be prevented in transportation of the substrates from the batch treatment region to the single-wafer treatment region.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
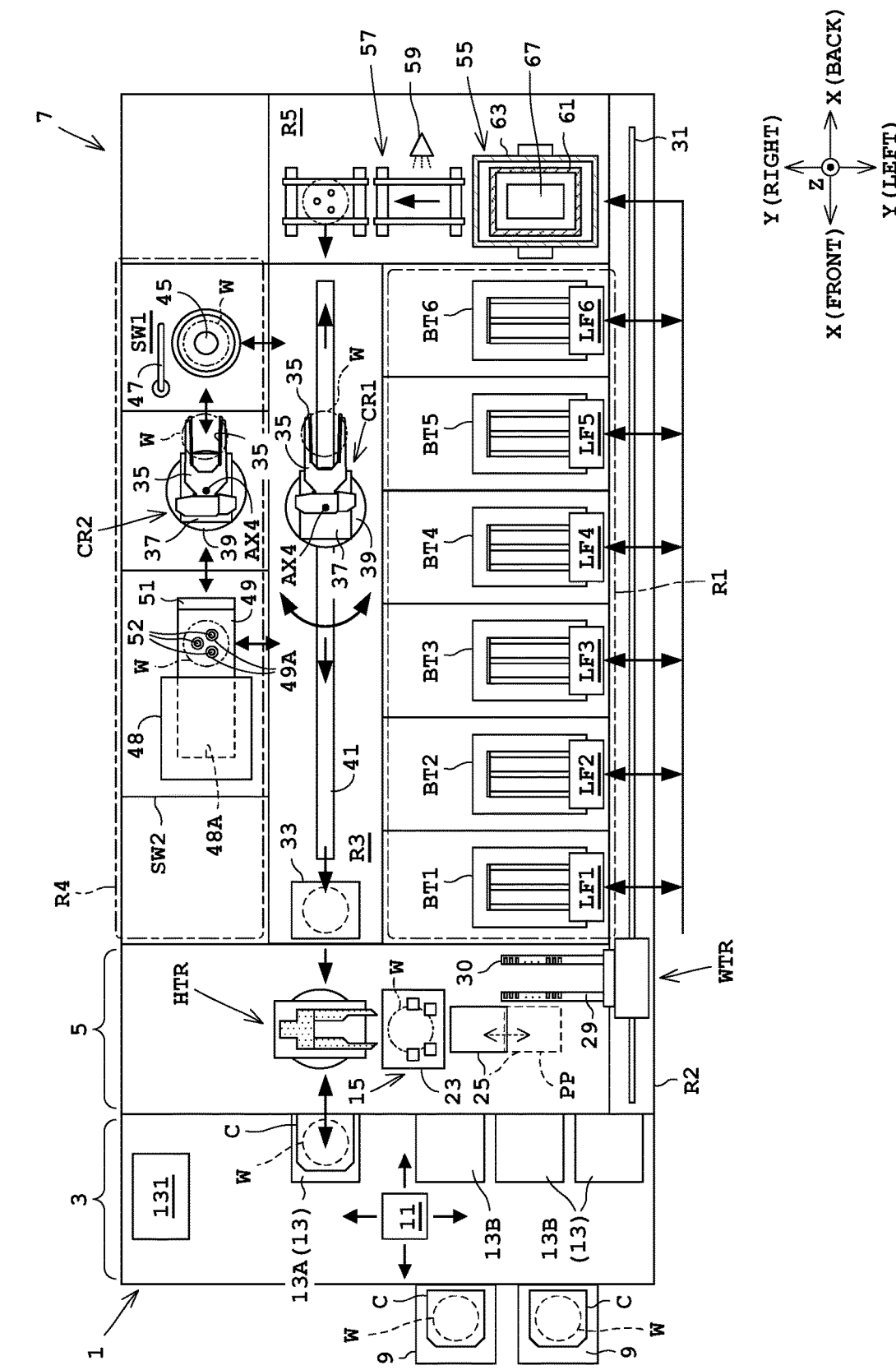
FIG. 1 is a plan view schematically illustrating a configuration of a substrate treating apparatus according to a first embodiment of the present invention.
Figure 2:
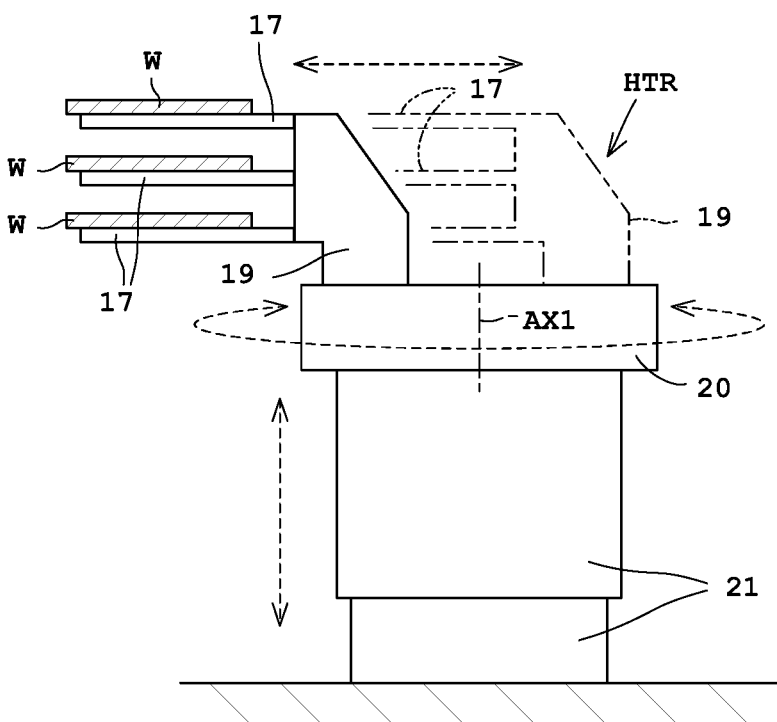
FIG. 2 is a side view of a substrate handling mechanism.
Figure 3A:
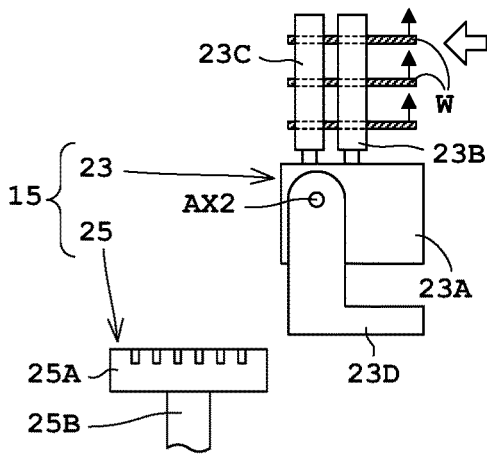
FIGS. 3A to 3C are each a side view illustrating a first posture turning mechanism (posture turning unit and pusher mechanism).
Figure 3B:
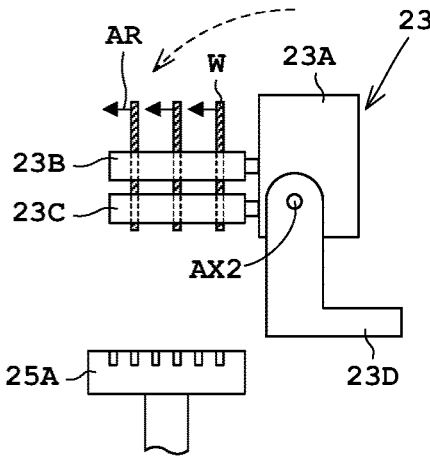
Figure 3C:
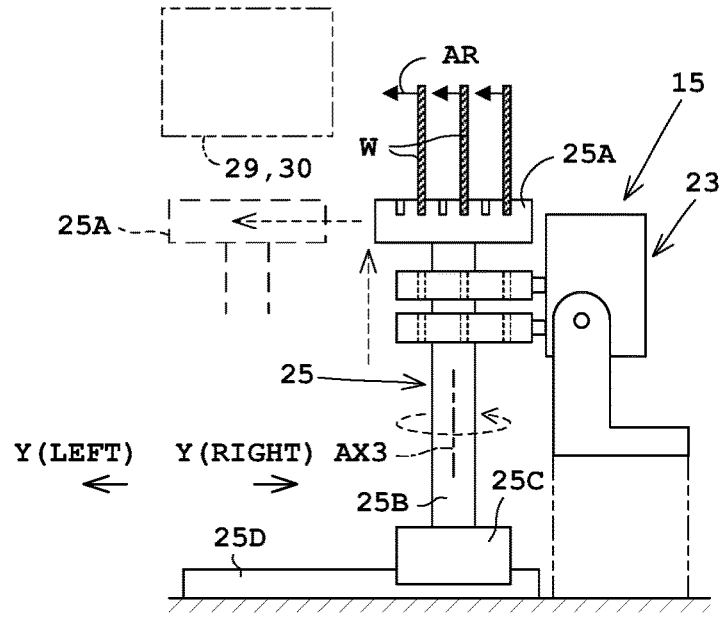

A first embodiment of the present invention will now be described with reference to the drawings. FIG. 1 is a plan view schematically illustrating a configuration of a substrate treating apparatus 1 according to a first embodiment of the present invention. FIG. 2 is a side view of a substrate handling mechanism HTR. FIGS. 3A to 3C are each a side view illustrating the first posture turning mechanism 15 (posture turning unit 23 and pusher mechanism 25).

1. Overall Configuration

Reference is made to FIG. 1. The substrate treating apparatus 1 includes a stocker block 3, a transferring block 5, and a treating block 7. The stocker block 3, the transferring block 5, and the treating block 7 are arranged in this order in line in a horizontal direction.

The substrate treating apparatus 1 performs chemical liquid treatment, cleaning treatment, dry treatment, and the like, for example, on the substrates W. The substrate treating apparatus 1 successively performs batch treatment and single-wafer treatment to substrates W. That is, the substrate treating apparatus 1 performs the batch treatment to the substrates W, and then performs the single-wafer treatment to the substrates W. The batch treatment is a process system of performing treatment collectively on a plurality of substrates W. The single-wafer treatment is a process system of performing treatment on a plurality of substrates W one by one.

In the present specification, the direction in which the stocker block 3, the transferring block 5, and the treating block 7 are arranged is referred to as a "front-back direction X" for convenience. The front-back direction X is horizontal. One direction of the front-back direction X from the transferring block 5 to the stocker block 3 is referred to as "forward". The direction opposite to the forward direction is referred to as "rearward". A horizontal direction orthogonal to the front-back direction X is referred to as a "transverse direction Y". One direction of the transverse direction Y is referred to as a "rightward direction" appropriately. The direction opposite to the rightward direction is referred to as "leftward". The perpendicular direction relative to the horizontal direction is referred to as a "vertical direction Z". For reference, FIG. 1 shows front, rear, right, left, up, and down, as appropriate, for example.

2. Stocker Block

The stocker block 3 accommodates at least one carrier C. One or more (e.g., two) load ports 9 are provided in the stocker block 3. The stocker block 3 includes a carrier transport mechanism (robot) 11 and shelves 13.

The carrier transport mechanism 11 transports the carrier C between the load port 9 and the shelf 13. The carrier transport mechanism 11 includes a gripper configured to grip a projected portion on an upper face of the carrier C, or a hand configured to support the carrier C while contacting a bottom face of the carrier C. The shelf 13 is classified into a shelf 13A for taking and housing the substrates W and a shelf 13B for storage.

The shelf 13A adjoins the transferring block 5. The shelf 13A may be provided with a mechanism for attaching and detaching a lid of the carrier C. At least one shelf 13A is provided. The shelf 13A places the carrier C thereon. The carrier C accommodates a plurality of (e.g., twenty-five) substrates W in a horizontal posture at a predetermined pitch (e.g., a pitch of 10 mm) in the vertical direction Z. Here, the substrates W are aligned in a thickness direction thereof. A front opening unify pod (FOUP) is used as the carrier C, for example. The FOUP is a sealing container. The carrier C may be an opened container, which type is not specified. The shelf 13A corresponds to a carrier mount shelf of the present invention.

3. Transferring Block

The transferring block 5 adjoins rearward X of the stocker block 3. The transferring block 5 includes a substrate handling mechanism (robot) HTR and a first posture turning mechanism 15.

The substrate handling mechanism HTR is provided rightward Y in the transferring block 5. The substrate handling mechanism HTR collectively takes a plurality of (e.g., twenty-five) substrates W from a carrier C placed on the shelf 13A, and transports the substrates W to the first posture turning mechanism 15. Moreover, the substrate handling mechanism HTR returns the substrates W, on which single-wafer treatment is performed, into the carrier C placed on the shelf 13A. For example, the substrate handling mechanism HTR takes a plurality of (e.g., twenty-five) substrates W from a buffer unit 33, and returns the substrates W into the carrier C placed on the mount shelf 13A. The substrate handling mechanism HTR can transport the substrates W among the carrier C placed on the shelf 13A, the first posture turning mechanism 15, and the buffer unit 33.

Reference is made to FIG. 2. The substrate handling mechanism HTR includes a plurality of (e.g., twenty-five) hands 17. In FIG. 2, the substrate handling mechanism HTR includes three hands 17 for convenience of illustration. The hands 17 each hold one substrate W.

The substrate handling mechanism HTR further includes a hand supporting portion 19, an advancing and withdrawing portion 20, and a lifting and rotating portion 21. The hand supporting portion 19 supports a plurality of hands 17. Accordingly, the hands 17 are moved integrally. The advancing and withdrawing portion 20 causes the hands 17 to advance and withdraw via the hand supporting portion 19. The lifting and rotating portion 21 rotates the advancing and withdrawing portion 20 around a vertical axis AX1, thereby rotating the hands 17 and the like around the vertical axis AX1. Moreover, the lifting and rotating portion 21 moves the advancing and withdrawing portion 20 upward and downward, thereby moving the hands 17 and the like upward and downward. The lifting and rotating portion 21 is fixed on the floor. That is, the lifting and rotating portion 21 does not move in the horizontal direction. Here, the advancing and withdrawing portion 20 and the lifting and rotating portion 21 each include an electric motor. Here, the substrate handling mechanism HTR may include another hand, not shown, for transporting one substrate W in addition to the hands 17 and the hand supporting portion 19.

Reference is made to FIG. 1. The first posture turning mechanism 15 collectively turns a posture of the substrates W from horizontal to vertical. The first posture turning mechanism 15 includes a posture turning unit 23 and a pusher mechanism 25. In FIG. 1, the substrate handling mechanism HTR, the posture turning unit 23, and the pusher mechanism 25 are arranged leftward Y in this order. FIGS. 3A to 3F are each a view illustrating the first posture turning mechanism 15.

As shown in FIG. 3A, the posture turning unit 23 includes a support base 23A, one-paired horizontal holders 23B, one-paired vertical holders 23C, and a rotation driving portion 23D. The one-paired horizontal holders 23B and the one-paired vertical holders 23C are provided on the support base 23A. The horizontal holders 23B and the vertical holders 23C receive the substrates W transported by the substrate handling mechanism HTR. When the substrates W are in the horizontal posture, the one-paired horizontal holders 23B support the substrates W from below while contacting a lower face of each of the substrates W. In contrast to this, when the substrates W are in the vertical posture, the one-paired vertical holders 23C hold the substrates W.

The rotation driving portion 23D supports the support base 23A rotatably around a horizontal axis AX2. Moreover, the rotation driving portion 23D rotates the support base 23A around the horizontal axis AX2, whereby a posture of the substrates W held by the holders 23B and 23C is turned from horizontal to vertical.

As illustrated in FIG. 3C, the pusher mechanism 25 includes a pusher 25A, a lifting and rotating portion 25B, a horizontally moving portion 25C, and a rail 25D. The pusher 25A supports each lower part of plurality of (e.g., twenty-five) substrates W in the vertical posture. Here in FIGS. 3A to 3C, it is assumed that the pusher 25A is configured to support three substrates W for convenience of illustration.

The lifting and rotating portion 25B is connected to a lower face of the pusher 25A. The lifting and rotating portion 25B expands and contracts, thereby moving the pusher 25A in the up-down direction. Moreover, the lifting and rotating portion 25B rotates the pusher 25A around a vertical axis AX3. This can change orientation of device faces of the substrates W, shown by an arrow AR, to any directions. The horizontally moving portion 25C supports the lifting and rotating portion 25B. The horizontally moving portion 25C moves the pusher 25A and the lifting and rotating portion 25B horizontally along the rail 25D. The rail 25D is formed so as to extend in the transverse direction Y. The rotation driving portion 23D, the lifting and rotating portion 25B, and the horizontally moving portion 25C each include an electric motor.

Description is now made of operation of the first posture turning mechanism 15. Batch process tanks BT1 to BT6, mentioned later, in the treating block 7 each perform treatment on twenty-five substrates W for one carrier C, for example, collectively. Accordingly, the first posture turning mechanism 15 collectively turns a posture of the twenty-five substrates W, taken out of the carrier C, from horizontal to vertical.

Reference is made to FIG. 3A. The posture turning unit 23 receives twenty-five substrates W, transported by the substrate handling mechanism HTR, with the holders 23B, 23C. At this time, the twenty-five substrates W are in a horizontal posture, and device faces thereof are directed upward. The twenty-five substrates W are arranged at a predetermined pitch (full pitch). Here, a full pitch is a pitch of 10 mm, for example. The full pitch is also called a normal pitch. Here, a half pitch is half the full pitch.

Moreover, a device face of a substrate W is a face where electronic circuits are formed, and is called a "front face". Moreover, a back face of the substrate W is a face where no electronic circuits are formed. A face opposite to the device face corresponds to the back face.

Reference is made to FIG. 3B. The posture turning unit 23 rotates the holders 23B, 23C by 90 degrees around the horizontal axis AX2 to turn a posture of the twenty-five substrates W from horizontal to vertical. Reference is made to FIG. 3C. The pusher mechanism 25 moves the pusher 25A upward to a position higher than the holders 23B, 23C of the posture turning unit 23. Accordingly, the pusher 25A receives the twenty-five substrates W from the holders 23B, 23C. The twenty-five substrates W held by the pusher 25A are directed leftward Y. Here, a direction of the device faces of the substrates W is denoted by an arrow AR.

Thereafter, the pusher mechanism 25 moves the pusher 25A, holding the twenty-five substrates W, to a substrate delivery position PP below one-paired chucks 29, 30 of a transport mechanism WTR, mentioned later, along the rail 25D.

4. Treating Block 7

The treating block 7 adjoins the transferring block 5. The treating block 7 is located rearward X of the transferring block 5. The treating block 7 includes a batch treatment region R1, a batch substrate transportation region R2, a single-wafer transportation region R3, a single-wafer treatment region R4, and a wet transportation region R5.

4-1. Batch Treatment Region R1

The batch treatment region R1 adjoins the transferring block 5, the batch substrate transportation region R2, the single-wafer transportation region R3, and the wet transportation region R5. Moreover, the batch treatment region R1 is provided between the batch substrate transportation region R2 and the single-wafer transportation region R3 in the transverse direction Y. Moreover, the batch treatment region R1 is provided between the transferring block 5 and the wet transportation region R5 in the front-back direction X. A first end side of the batch treatment region R1 adjoins the transferring block 5. A second end side of the batch treatment region R1, i.e., batch treatment region R1, extends in a direction apart from the transferring block 5 (rearward X).

The batch treatment region R1 contains six batch process tanks BT1 to BT6, for example. The six batch process tanks BT1 to BT6 are arranged in line in a direction where the batch treatment region R1 extends (front-back direction X). The six batch process tanks BT1 to BT6 each perform immersion treatment on a plurality of substrates W collectively. For example, the six batch process tanks BT1 to BT6 is formed by four chemical liquid process tanks BT1 to BT4 and two water cleaning process tanks BT5 and BT6. Specifically, the two chemical liquid process tanks BT1 and BT2 and the water cleaning process tank BT5 are set as one set. Then, the two chemical liquid process tanks BT3 and BT4 and the water cleaning process tank BT6 are set as another set. Note that a combination of the chemical liquid process tanks and the water cleaning process tank is not limited to this example. Moreover, the number of batch process tanks is not limited to six, and the number only needs to be plural.

The four chemical liquid process tanks BT1 to BT4 each perform etching treatment with chemical. A phosphoric acid liquid is used as the chemical, for example. The chemical liquid process tank BT1 stores the chemical supplied from a chemical liquid jet pipe, not shown. The chemical liquid jet pipe is provided in an inner wall of the chemical liquid process tank BT1. The three chemical liquid process tanks BT2 to BT4 are each configured in the same manner as the chemical liquid process tank BT1.

The two water cleaning process tanks BT5 and BT6 each perform pure water cleaning treatment by cleaning off the chemical, adhered to the substrates W, with pure water. Deionized water (DIW) is, for example, used as pure water. The two water cleaning process tanks BT5 and BT6 each store deionized water supplied from a cleaning liquid jet pipe, not shown. The cleaning liquid jet pipe is provided in inner walls of the water cleaning process tanks BT5 and BT6.

The six batch process tanks BT1 to BT6 contain six lifters LF1 to LF6, respectively. For example, the lifter LF1 holds the substrates W arranged at a predetermined pitch (e.g., full pitch of 10 mm) in the vertical posture. Moreover, the lifter LF1 moves the substrates W upward and downward between a treating position inside of the batch process tank (chemical liquid process tank) BT1 and a delivery position above the batch process tank BT1. The other five lifters LF2 to LF6 are configured in the same manner as the lifter LF1.

4-2. Batch Substrate Transportation Region R2

The batch substrate transportation region R2 adjoins the transferring block 5, the batch treatment region R1, and the wet transportation region R5. The batch substrate transportation region R2 is provided along the batch treatment region R1. The batch substrate transportation region R2 has a first end side extending to the transferring block 5, and a second end side extending in a direction (rearward X) so as to be apart from the transferring block 5. The batch substrate transportation region R2 extends parallel to the batch treatment region R1.

The batch substrate transportation region R2 has a transport mechanism (robot) WTR. That is, the batch substrate transportation region R2 is provided with the transport mechanism WTR. The transport mechanism WTR transports a plurality of (e.g., twenty-five) substrates W in a vertical posture collectively among the substrate delivery position PP defined in the transferring block 5, the six batch process tanks BT1 to BT6, for example, and a second posture turning unit 55.

The transport mechanism WTR includes the one-paired chucks 29, 30, and a guide rail 31. The one-paired chucks 29, 30 each have twenty-five holding grooves for holding the twenty-five substrates W individually, for example. The two chucks 29, 30 extend in parallel in the transverse direction Y in plan view (FIG. 1). The transport mechanism WTR opens and closes the two chucks 29, 30. The transport mechanism WTR moves the one-paired chucks 29, 30, along the guide rail 31. The transport mechanism WTR is driven by an electric motor.

4-3. Single-Wafer Transportation Region R3

The single-wafer transportation region R3 adjoins the transferring block 5, the batch treatment region R1, the single-wafer treatment region R4, and the wet transportation region R5. Moreover, the single-wafer transportation region R3 is provided between the batch treatment region R1 and the single-wafer treatment region R4. The single-wafer transportation region R3 has a first end side adjoining the transferring block 5. Moreover, the single-wafer transportation region R3 has a second end side (i.e., single-wafer transportation region R3) extending in a direction so as to be apart from the transferring block 5 (rearward X).

The single-wafer transportation region R3 contains a first center robot CR1 and the buffer unit 33. The first center robot CR1 transports substrates W in a horizontal posture among a belt conveyor mechanism 57 mentioned later, a first single-wafer processing chamber SW1 mentioned later, a second single-wafer processing chamber SW2 mentioned later, and the buffer unit 33. The first center robot CR1 includes two hands 35, an advancing and withdrawing portion 37, a lifting and rotating portion 39, and a horizontally moving unit 41 (including a guide rail).

The two hands 35 each hold one substrate W in a horizontal posture. Here, a first hand 35 is used for transporting wet substrates W, and a second hand 35 is used for transporting dried substrates W. The advancing and withdrawing portion 37 supports the two hands 35 movably, and moves the two hands 35 forward and rearward individually. The lifting and rotating portion 39 rotates the hands 35 and the advancing and withdrawing portion 37 around a vertical axis AX4. Moreover, the lifting and rotating portion 39 moves the hands 35 and the advancing and withdrawing portion 37 upward and downward. The guide rail is provided on a floor of the single-wafer transportation region R3 along a direction where the single-wafer transportation region R3 extends. The horizontally moving unit 41 moves the two hands 35, the advancing and withdrawing portion 37, and the like along the guide rail in the front-back direction X. Here, the advancing and withdrawing portion 37, the lifting and rotating portion 39, and the horizontally moving unit 41 each include an electric motor.

For example, the advancing and withdrawing portion 37 moves the first hand forward to take one substrate W from the belt conveyor mechanism 57. Then, the advancing and withdrawing portion 37 moves the first hand 35 forward to transport the one substrate W to the first single-wafer processing chamber SW1. Here, the first center robot CR1 may include three or more hands 35. When the first center robot CR1 includes three or more hands 35, the first center robot CR1 moves the three or more hands 35 forward and rearward individually.

The buffer unit 33 includes a plurality of mount shelves. The mount shelves are in a horizontal posture. Each of the mount shelves is capable of placing one substrate W thereon. The buffer unit 33 places the substrates W in the horizontal posture at a predetermined pitch (full pitch) in the vertical direction Z. That is, the mount shelves are arranged at a predetermined pitch (full pitch) in the vertical direction Z. The buffer unit 33 is configured, for example, so as to place thereon at least twenty-five substrates W that the substrate handling mechanism HTR can transport. Here, the buffer unit 33 may be configured to be capable of placing two or more and less than twenty-five substrates W thereon.

Moreover, the buffer unit 33 may be provided in the transferring block 5 and the single-wafer transportation region R3. That is, the buffer unit 33 may be provided on a boundary between the transferring block 5 and the single-wafer transportation region R3. Moreover, the buffer unit 33 may be provided in the transferring block 5 only. Accordingly, the buffer unit 33 only need to be provided fixedly in any of the boundary between the transferring block 5 and the single-wafer transportation region R3, the transferring block 5, or the single-wafer transportation region R3. The first center robot CR1 corresponds to the single-wafer substrate transport mechanism in the present invention.

4-4. Single-Wafer Treatment Region R4

The single-wafer treatment region R4 adjoins the transferring block 5 and the single-wafer transportation region R3. The single-wafer treatment region R4 has a first end side adjoining the transferring block 5, and a second end side extending in a direction so as to be apart from the transferring block 5 (rearward X). Moreover, the single-wafer treatment region R4 is provided along the batch treatment region R1 and the single-wafer transportation region R3.

A plurality of (e.g., two) single-wafer processing chambers SW1, SW2 are provided in the single-wafer treatment region R4. The two single-wafer processing chambers SW1, SW2 are arranged in the front-back direction X where the single-wafer treatment region R4 extends. The single-wafer processing chambers SW1, SW2 are each configured to perform treatment on substrates W one by one. A first single-wafer processing chamber SW1 is positioned farthest from the transferring block 5. A second single-wafer processing chamber SW2 is arranged forward X of the first single-wafer processing chamber SW1. The two single-wafer processing chambers SW1, SW2 may be formed in plural steps. For example, six single-wafer processing chambers may be arranged two in the front-back direction X (horizontal direction) by three in the vertical direction Z.

For example, the first single-wafer processing chamber SW1 includes a rotating unit 45 and a nozzle 47. The rotating unit 45 includes a spin chuck configured to hold one substrate W in a horizontal posture, and an electric motor configured to rotate the spin chuck around a vertical axis passing through the center of the substrate W.

The nozzle 47 supplies a treatment liquid to the substrate W held by the rotating unit 45. The nozzle 47 moves between a standby position apart from the rotating unit and a supply position above the rotating unit 45. Deionized water (DIW) or Isopropyl alcohol (IPA) is used, for example, as the treatment liquid. The first single-wafer processing chamber SW1 may each perform cleaning treatment on substrates W with deionized water, and then perform preliminary dry treatment with IPA, or may form an IPA liquid film on top faces of the substrates W, for example.

The second single-wafer processing chamber SW2 performs dry treatment with supercritical fluid, for example. A carbon dioxide liquid is used as the fluid, for example. The second single-wafer processing chamber SW2 includes a chamber body (vessel) 48, a supporting tray 49, a lid 51, and three lift pins 52. The chamber body 48 includes a treating space 48A provided therein, an opening through which the substrates W enter the treating space 48A, a supply port, and an exhaust port. The supporting tray 49 has three holes 49A through which the three lift pins 52 pass individually. The three lift pins 52 are movable upward and downward. Under a condition where the supporting tray 49 is removed from the treating space 48A as shown in FIG. 1, the three lift pins 52 can pass through the three holes 49A individually. Accordingly, the three lift pins 52 can move substrates W upward from the supporting tray 49, or move substrates W downward to the supporting tray 49. The first center robot CR1 and a second center robot CR2 mentioned later can deliver substrates W when the three lift pins 52 are moved upward.

The substrates W are accommodated into the treating space 48A while being supported by the supporting tray 49. The lid 51 closes the opening of the chamber body 48. For example, the second single-wafer processing chamber SW2 makes the fluid into a supercritical state and supplies the supercritical fluid from the supply port into the treating space in the chamber body 48. At this time, gas within treating space 48A in the chamber body 48 is exhausted from the exhaust port. With the supercritical fluid supplied to the treating space 48A, dry treatment is performed on the substrates W.

The supercritical state is obtained by bringing fluid into critical temperature and pressure inherent in the fluid. Specifically, when the fluid is carbon dioxide, a critical temperature is 31 degrees Celsius and critical pressure is 7.38 MPa. Under the supercritical state, the fluid has a surface tension of approximately zero. Accordingly, patterns of the substrate W are not affected by a gas-liquid interface. Consequently, pattern collapse is unlikely to occur in the substrate W.

Moreover, the single-wafer treatment region R4 further contains the second center robot CR2 for transporting substrates W between the first single-wafer processing chamber SW1 and the second single-wafer processing chamber SW2. The second center robot CR2 transports the substrates W from the first single-wafer processing chamber SW1 to the second single-wafer processing chamber SW2. The second center robot CR2 is configured in the same manner as the first center robot CR1 except for the feature that a lower end of the lifting and rotating portion 39 is fixed on the floor. The second center robot CR2 includes two hands 35, an advancing and withdrawing portion 37, and a lifting and rotating portion 39. The hands 35 each transport wet substrate W.

4-5. Wet Transportation Region R5

The wet transportation region R5 adjoins the batch treatment region R1, the batch substrate transportation region R2, and the single-wafer transportation region R3. The wet transportation region R5 is provided on a first end of the batch treatment region R1 opposite to the transferring block 5. The wet transportation region R5 contains the second posture turning unit (underwater posture turning unit) 55, the belt conveyor mechanism 57, and a plurality of shower heads 59.

Here, the second posture turning unit 55 corresponds to the second posture turning mechanism of the present invention. The shower heads 59 correspond to the liquid supplying unit in the present invention.

4-5-1. Second Posture Turning Unit 55

Figure 4:
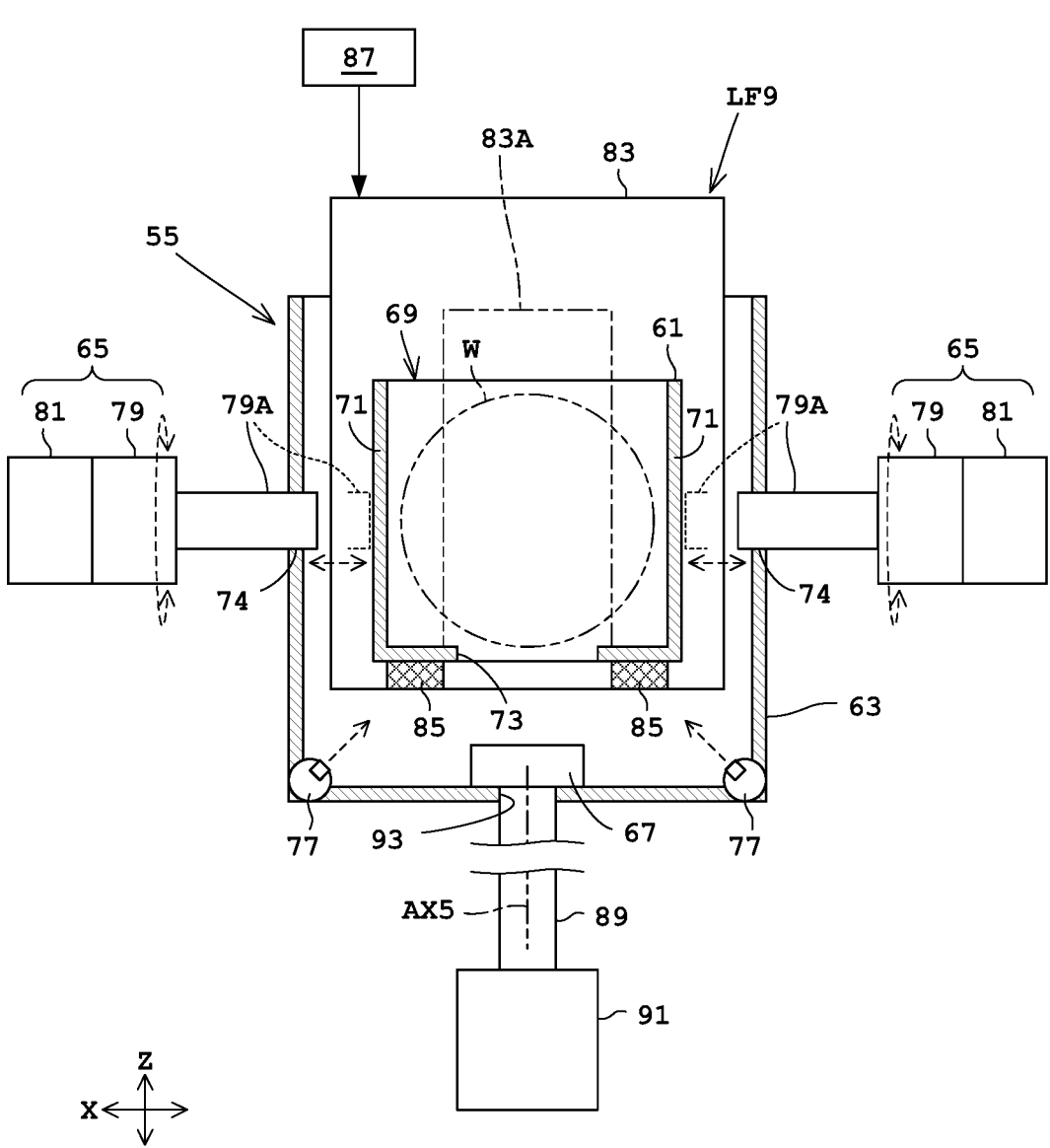
FIG. 4 is a longitudinal sectional front view of a second posture turning unit.
Figure 5A:
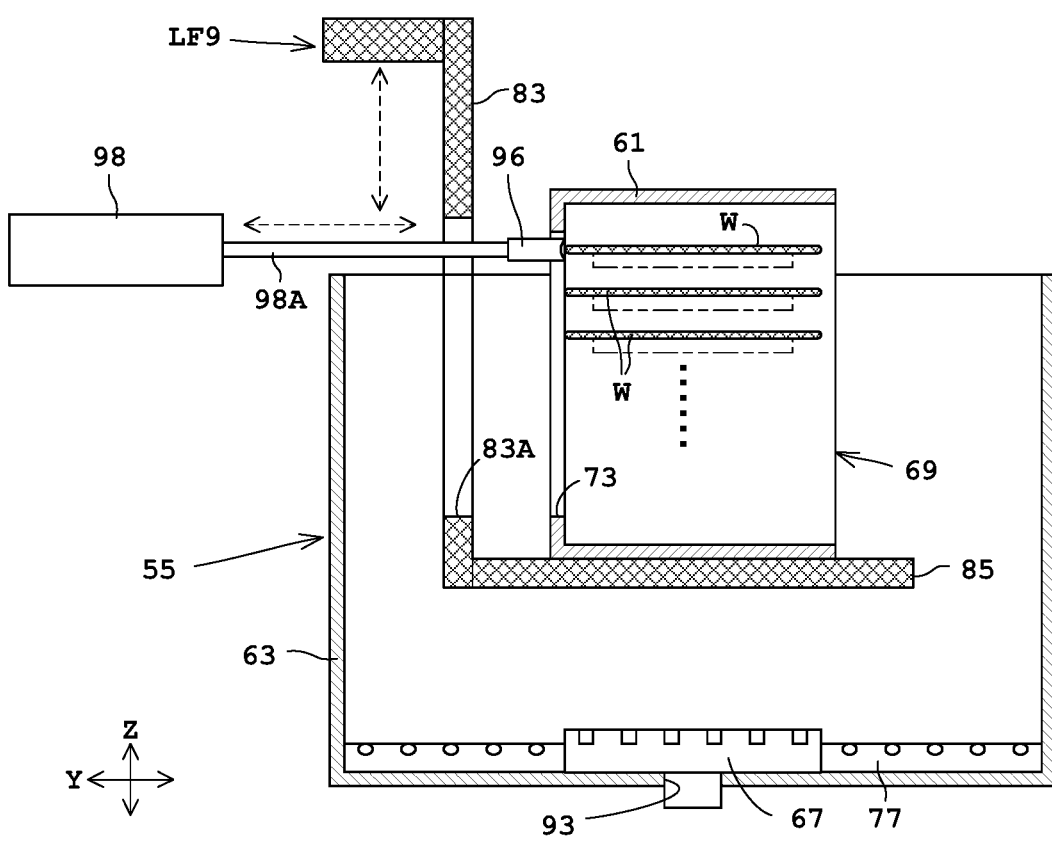
FIG. 5A is a longitudinal sectional view of the second posture turning mechanism from a left side.
Figure 5B:
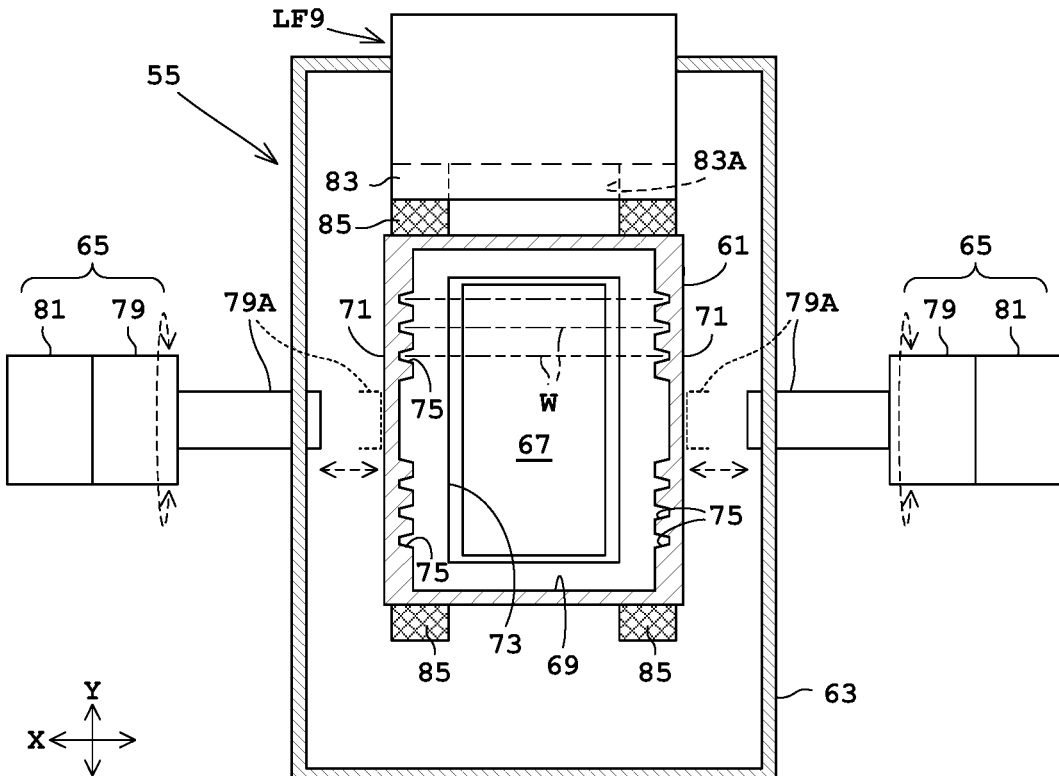
FIG. 5B is a plan view of the second posture turning unit.

As shown in FIG. 1, the second posture turning unit 55 is provided on an extension line of a line of the six batch process tanks BT1 to BT6. The second posture turning unit 55 turns a posture of the substrates W, on which immersion treatment is performed, from vertical to horizontal. FIG. 4 is a longitudinal sectional front view of the second posture turning unit 55. FIG. 5A is a longitudinal sectional view of the second posture turning unit 55 seen from a left side. FIG. 5B is a plan view of the second posture turning unit 55.

The second posture turning unit 55 includes an in-tank carrier 61, an immersion tank 63, a rotating mechanism 65, a lifter LF9, and a pusher 67. The in-tank carrier 61 can accommodate a plurality of (e.g., twenty-five) substrates W. In this case, the in-tank carrier 61 accommodates twenty-five substrates W at a predetermined pitch (e.g., full pitch). The twenty-five substrates W are aligned in a thickness direction thereof.

The in-tank carrier 61 includes a passage 69, two side walls 71, and a rear opening 73. The passage 69 is an opening used to pass the substrates W therethrough. The two side walls 71 have plural-paired (twenty-five-paired) holding grooves 75 formed therein. The twenty-five-paired holding grooves 75 face in pairs. The twenty-five-paired holding grooves 75 accommodate twenty-five substrates W passing through the passage 69. That is, the paired holding grooves 75 each accommodate one substrate W. The rear opening 73 is located so as to face the passage 69 across the twenty-five substrates W accommodated in the in-tank carrier 61. The rear opening 73 has a width in a radial direction of each of the substrates W (front-back direction X) smaller than a diameter of each of the substrates W. Accordingly, the substrates W cannot be move forward and rearward from the rear opening 73. Here, when the passage 69 of the in-tank carrier 61 is directed upward, the pusher 67 can pass through the passage 69 and the rear opening 73.

The immersion tank 63 accommodates the in-tank carrier 61 and two carrier supporting portions 85 mentioned later of the lifter LF9. The immersion tank 63 stores pure water, for example, as an immersion liquid. Accordingly, the in-tank carrier 61 can be immersed in the pure water within the immersion tank 63. This can prevent drying of the substrates W. Here, the immersion liquid is not limited to pure water, but may be alcohol. Moreover, deionized water (DIW), for example, is used as pure water. The immersion tank 63 includes jet pipes 77 at both sides of the bottom face thereof in the front-back direction X. The jet pipes 77 are each formed in a cylindrical shape so as to extend in the transverse direction Y. The jet pipes 77 each jet pure water into the immersion tank 63.

The rotating mechanism 65 rotates the in-tank carrier 61 around two operating shafts 79A, mentioned later, while gripping the in-tank carrier 61 with the two operating shafts 79A for turning a posture of twenty-five substrates W, accommodated in the in-tank carrier 61, from vertical to horizontal. The rotating mechanism 65 includes two air cylinders 79 and two electric motors 81.

The air cylinders 79 each have an operating shaft 79A extending in the front-back direction X. The immersion tank 63 has two through holes 74 formed therein. The two operating shafts 79A pass through two through holes 74, respectively. The two air cylinders 79 cause the two operating shafts 79A to move forward in the front-back direction X, whereby the two side walls 71 of the in-tank carrier 61 are gripped with the two operating shafts 79A. Accordingly, the two operating shafts 79A are integrated with the in-tank carrier 61. Moreover, the two air cylinders 79 cause the two operating shafts 79A to move rearward in the front-back direction X, whereby the in-tank carrier 61 is released from being gripped with the two operating shafts 79A. The operating shafts 79A each correspond to the rotation shaft in the present invention.

The two electric motors 81 rotate the two air cylinders 79 around the two operating shafts 79A (horizontal axis). Accordingly, the two electric motors 81 can rotate the in-tank carrier 61 gripped with the two operating shafts 79A.

The lifter LF9 includes a back plate 83, the two carrier supporting portions 85, and a carrier lifting and lowering portion 87. The back plate 83 extends in the vertical direction Z. The back plate 83 has a back plate opening 83A through which a pushing member 96 mentioned later passes. The two carrier supporting portions 85 are attached to a lower end of the back plate 83, and extend in the transverse direction Y. A gap between the two carrier supporting portions 85 is larger than a width of the rear opening 73 in the front-back direction X. The two carrier supporting portions 85 support the in-tank carrier 61 from below. The carrier lifting and lowering portion 87 moves the back plate 83 and the two carrier supporting portions 85 upward and downward, thereby moving the in-tank carrier 61, supported by the two carrier supporting portions 85, upward and downward. The carrier lifting and lowering portion 87 includes an electric motor.

Moreover, the second posture turning unit 55 further includes a vertical shaft 89 and a pusher lifting and rotating portion 91 in addition to the pusher 67. The pusher 67 holds a plurality of (e.g., twenty-five) substrates W in a vertical posture from below. The pusher 67 has a lower face connected to an upper end of the vertical shaft 89. The vertical shaft 89 extends in the vertical direction Z. As shown in FIG. 4, a through hole 93 is formed in the bottom of the immersion tank 63. The vertical shaft 89 passes the through hole 93. The pusher lifting and rotating portion 91 moves the pusher 67 and the vertical shaft 89 upward and downward, and rotates the pusher 67 and the vertical shaft 89 around a vertical axis AX5. The pusher lifting and rotating portion 91 includes a plurality of electric motors, for example.

Moreover, as shown in FIG. 5A, the second posture turning unit 55 includes the pushing member 96 and a pushing member advancing and withdrawing portion 98. The pushing member 96 is used for pushing out one substrate W to be accommodated in the in-tank carrier 61. The pushing member 96 is connected to a distal end of a rod 98A of the pushing member advancing and withdrawing portion 98 that is capable of moving forward and rearward. The pushing member advancing and withdrawing portion 98 moves the pushing member 96 forward and rearward horizontally. The pushing member advancing and withdrawing portion 98 includes an electric motor or an air cylinder. When a plurality of (e.g., twenty-five) substrates W accommodated in the in-tank carrier 61 are in a horizontal posture, the pushing member advancing and withdrawing portion 98 pushes out one substrate W through the passage 69 while moving the pushing member 96 forward from the back plate opening 83A and the rear opening 73 into the in-tank carrier 61. Here, the substrate W may be pushed out from the in-tank carrier 61 by jetting a liquid to an edge of the substrate W.

4-5-2. Belt Conveyor Mechanism 57

Figure 6A:
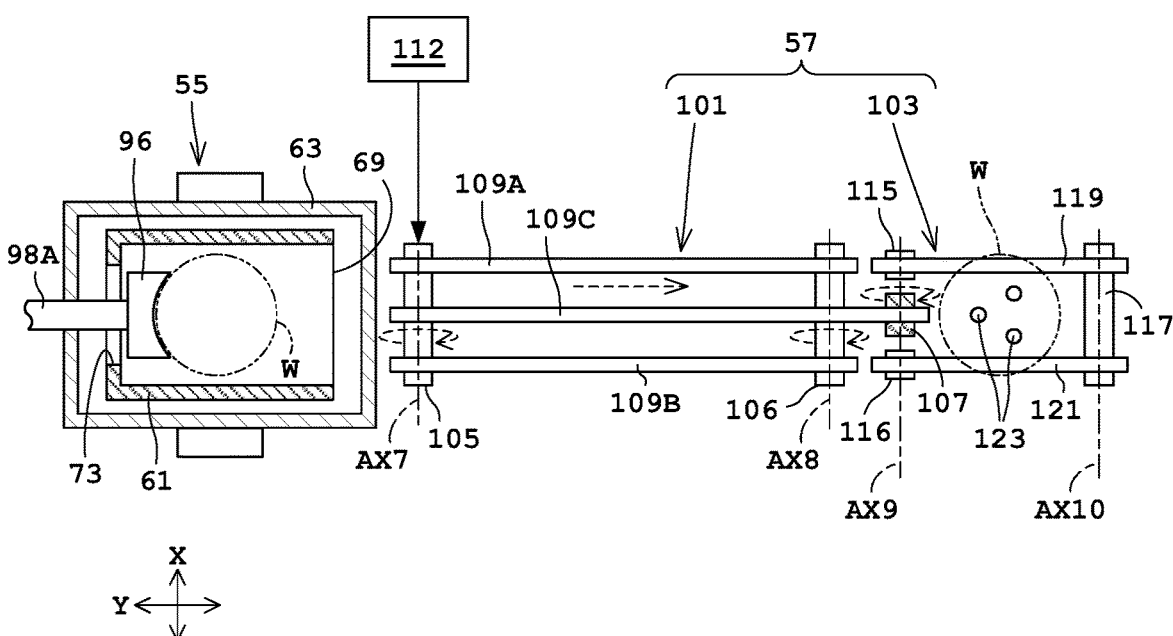
FIG. 6A is a plan view of a belt conveyor mechanism.
Figure 6B:
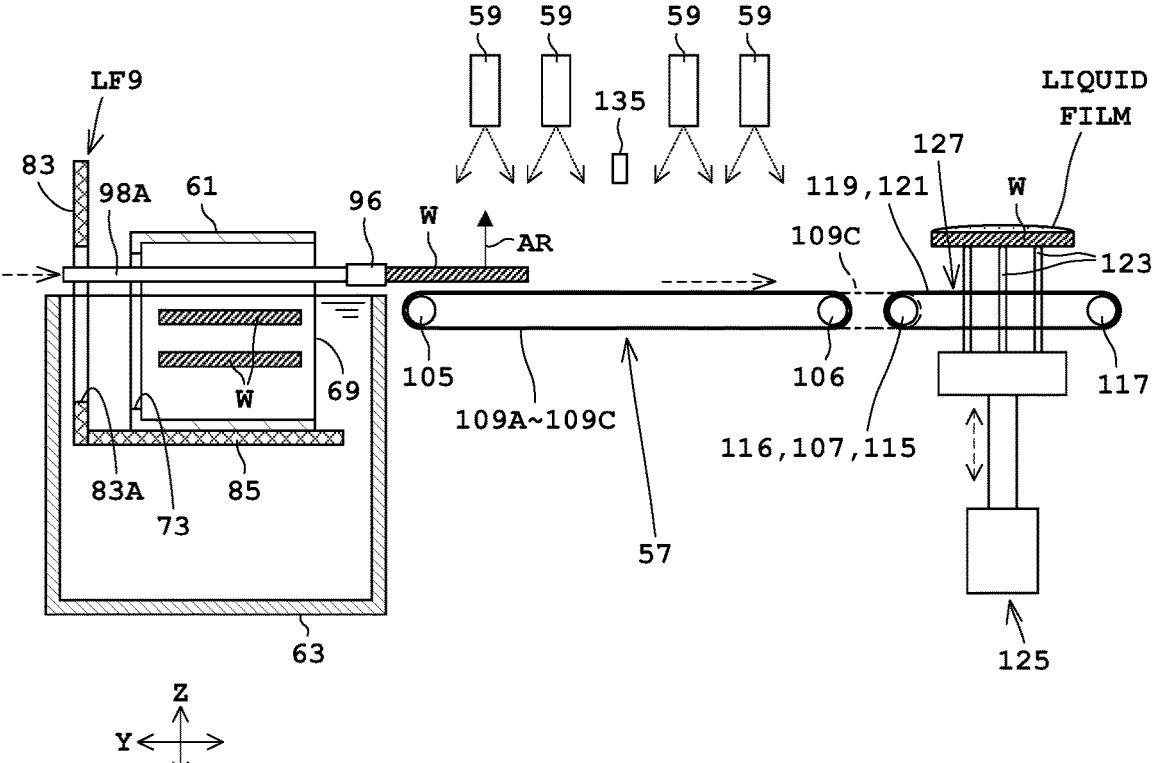
FIG. 6B is a left side view of the belt conveyor mechanism and shower heads.

FIG. 6A is a plan view of the belt conveyor mechanism 57. FIG. 6B is a left side view of the belt conveyor mechanism 57 and the shower heads 59. The one substrate W pushed out from the in-tank carrier 61 by the pushing member 96 is delivered to the belt conveyor mechanism 57. The belt conveyor mechanism 57 receives substrates W in a horizontal posture one by one from the second posture turning unit 55, and transports the substrates W to the single-wafer transportation region R3.

The belt conveyor mechanism 57 includes a belt conveyor 101 and a delivery portion 103. The belt conveyor 101 transports the substrates W from the second posture turning unit 55 to the delivery portion 103. The belt conveyor 101 includes three pulleys 105, 106, 107, three belts 109A, 109B, 109C, and an electric motor 112.

The three pulleys 105, 106, 107 are arranged in this order in the transverse direction Y from a side adjacent to the second posture turning unit 55. The three pulleys 105, 106, 107 are supported in a rotatable manner around horizontal axes AX7, AX8, AX9, respectively. Moreover, the pulley 107 is arranged adjacent to three lift pins 123, mentioned later, of the delivery portion 103.

The three belts 109A, 109B, 109C are each formed in a ring shape. The three belts 109A, 109B, 109C each have a circular cross section, for example. The two belts 109A, 109B are each wound on the two pulleys 105, 106, respectively. Moreover, the belt 109C is arranged between the two belts 109A, 109B, and is wound on the three pulleys 105, 106, 107.

The electric motor 112 causes the pulley 105 to rotate, for example, whereby the substrate W placed on the three belts 109A to 109C is transported. Moreover, the belt 109C of the belt conveyor 101 is wound on the pulley 107, and thus the substrate W is movable close to the three lift pins 123.

The delivery portion 103 includes three pulleys 115, 116, 117, two belts 119, 121, three lift pins 123, and a lift pin lifting and lowering portion 125. The three pulleys 115, 116, 117 are each rotatably freely. The two pulleys 115, 116 are arranged along a horizontal axis AX9. Moreover, the third pulley 107 of the belt conveyor 101 is arranged between the two pulleys 115, 116. The two pulleys 115, 116 are each rotatably supported around the horizontal axis AX9. The pulley 117 is supported rotatably around a horizontal axis AX10. The belt 119 is wound on the two pulleys 115, 117. Moreover, the belt 121 is wound on the two pulleys 116, 117.

Since the delivery portion 103 includes no electric motor, the delivery portion 103 cannot drive the two belts 119, 121 by itself. However, the delivery portion 103 having an electric motor may drive the belts 119, 121.

The belt conveyor 101 includes the belts 109A to 109C in addition to the belts 119, 121 of the delivery portion 103. Accordingly, even when a substrate W is placed on the belts 119, 121, another substrate W placed on the belts 109A to 109C can be moved.

As shown in FIG. 6A, the three lift pins 123 are arranged between the two belts 119, 121. The lift pin lifting and lowering portion 125 moves the three lift pins 123 upward and downward between a standby position below and a delivery position above. When the three lift pins 123 are moved upward to the delivery position, the substrate W is lifted from the belts 119, 121. Moreover, when the three lift pins 123 are moved downward to the standby position, upper ends of the lift pins 123 are each positioned lower than a transport face 127 of each of the two belts 119, 121 so as not to prevent transport of the substrate W. The lift pin lifting and lowering portion 125 includes an electric motor or an air cylinder.

As shown in FIG. 6B, the shower heads 59 supply a liquid for wetting therewith the substrates W transported by the belt conveyor mechanism 57. Deionized water (DIW) is supplied, for example, as the liquid. Here, the liquid may be alcohol like IPA. The shower heads 59 are arranged in line along the three belts 109A to 109C of the belt conveyor 101 (transportation direction). Orientation of a device face of the substrate W in the horizontal posture on the belt conveyor 101 (by arrow AR) is upward. Accordingly, a liquid film of deionized water can be formed on the device face of the substrate W. Here, the wet transportation region R5 may include one shower head 59 for one belt conveyor 101.

5. Controller

The substrate treating apparatus 1 includes a controller 131 (see FIG. 1) and a memory unit (not shown). The controller 131 controls components of the substrate treating apparatus 1. The controller 131 includes one or more processors like a central processing unit (CPU). The memory unit includes, for example, at least one of a read-only memory (ROM), a random-access memory (RAM), and a hard disk. The memory unit stores computer programs necessary for controlling each component of the substrate treating apparatus 1.

6. Operation Explanation

Figure 7:
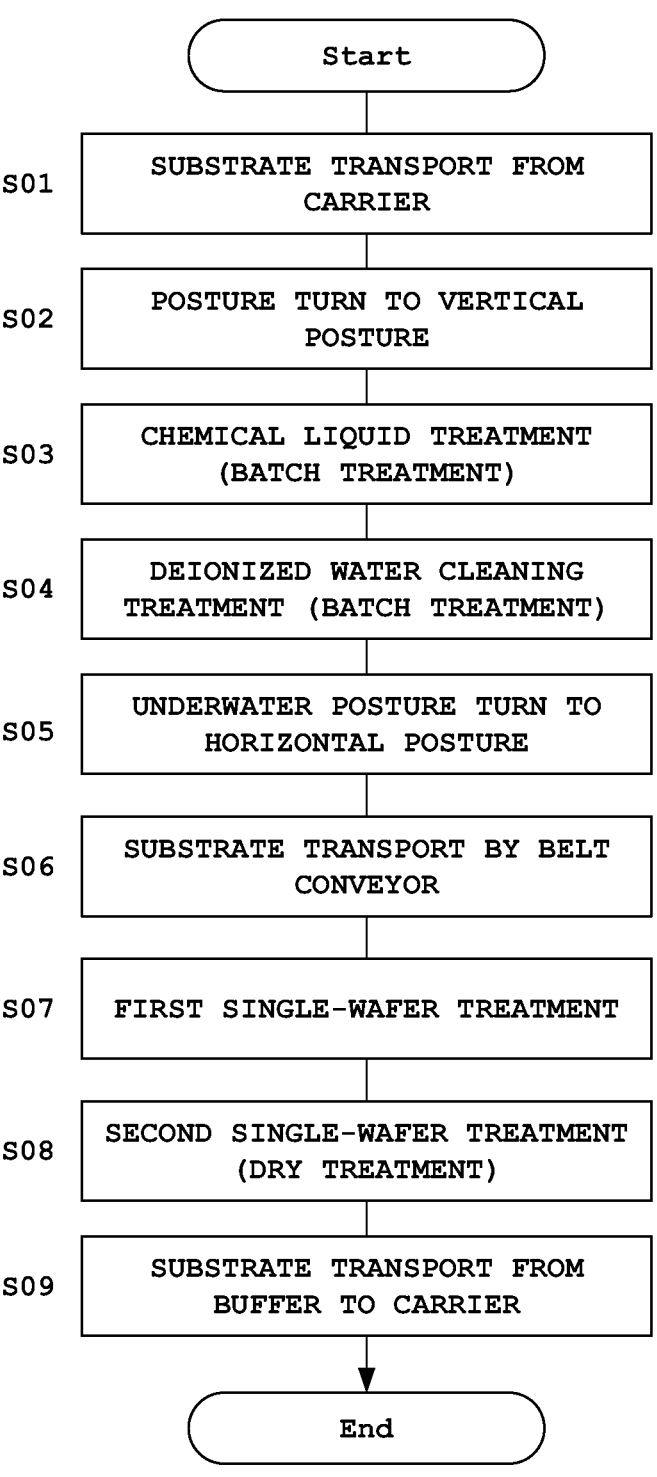
FIG. 7 is a flowchart illustrating operation of the substrate treating apparatus.

The following describes operation of the substrate treating apparatus 1 with reference to flowcharts in FIG. 7. Reference is made to FIG. 1. An external transport robot, not shown, transports one carrier C into the load port 9.

[Step S01] Transport of Substrate from Carrier

The carrier transport mechanism 11 of the stocker block 3 transports a carrier C from the load port 9 to a shelf 13A. The substrate handling mechanism HTR of the transferring block 5 takes twenty-five substrates W in a horizontal posture from the carrier C placed on the shelf 13A, and transports the substrates W to the posture turning unit 23.

[Step S02] Posture Turn to Vertical Posture

As shown in FIGS. 3A to 3C, the posture turning unit 23 turns a posture of the twenty-five substrates W from horizontal to vertical, and delivers the twenty-five substrates in the vertical posture to the pusher mechanism 25. The pusher mechanism transports the twenty-five substrates W in the vertical posture to the substrate delivery position PP determined in the transferring block 5.

[Step S03] Chemical Treatment (Batch Treatment)

The transport mechanism WTR receives the twenty-five substrates W in the vertical posture from the pusher mechanism 25 at the substrate delivery position PP, and transports the twenty-five substrates W to any of the four lifters LF1 to LF4 in the four chemical liquid process tanks BT1 to BT4, respectively.

For example, the transport mechanism WTR transports the twenty-five substrates W to the lifter LF1 of the chemical liquid process tank BT1. The lifter LF1 receives the twenty-five substrates W at a position above the chemical liquid process tank BT1. The lifter LF1 immerses the twenty-five substrates W in phosphoric acid as the treatment liquid within the chemical liquid process tank BT1. Accordingly, an etching treatment is performed on the twenty-five substrates W. After the etching treatment, the lifter LF1 pulls up the twenty-five substrates W from the phosphoric acid within the chemical liquid process tank BT1. It should be noted that similar treatment as in the chemical liquid process tank BT1 is performed when the twenty-five substrates W are transported to the other lifters LF2 to LF4 of the chemical liquid process tanks BT2 to BT4, respectively.

[Step S04] Deionized Water Cleaning Treatment (Batch Treatment)

The transport mechanism WTR receives the twenty-five substrates W in the vertical posture from the lifter LF1 (or lifter LF2), for example, and transports the twenty-five substrates W to the lifter LF5 of the water cleaning process tank BT5. The lifter LF5 receives the twenty-five substrates W at a position above the water cleaning process tank BT5. The lifter LF5 immerses the twenty-five substrates W in the deionized water within the water cleaning process tank BT5. Accordingly, a cleaning treatment is performed on the twenty-five substrates W.

Here, when the transport mechanism WTR receives the twenty-five substrates W in the vertical posture from either the lifter LF3 or LF4, the transport mechanism WTR transports the twenty-five substrates W to the lifter LF6 of the water cleaning process tank BT6. The lifter LF6 immerses the twenty-five substrates W in the deionized water within the water cleaning process tank BT6.

In this embodiment, the second posture turning unit 55 is provided opposite to the transferring block 5 across the six batch process tanks BT1 to BT6. The transport mechanism WTR transports twenty-five substrates W collectively to the second posture turning unit 55 from the batch process tank BT1 (BT3), for example, adjacent to the transferring block 5, through the batch process tank BT5 (BT6), apart from the transferring block 5.

[Step S05] Posture Turn to Horizontal Posture

FIGS. 8A to 10 are each a front view illustrating operation of the second posture turning unit 55. When the carrier supporting portions 85 of the lifter LF9 are located at a first height position P1, the carrier supporting portions 85 are positioned near the bottom face of the immersion tank 63. When the carrier supporting portions 85 are located at the first height position P1, the rotating mechanism 65 can rotate the in-tank carrier 61 vertically in the immersion tank 63. When the carrier supporting portions 85 are located at a second height position P2, the in-tank carrier 61 is entirely positioned below a liquid level of the immersion tank 63. When the carrier supporting portions 85 are located at the second height position P2, the rotating mechanism 65 can grip the in-tank carrier 61 whose passage 69 is directed upward.

When the carrier supporting portions 85 are located at a third height position P3, twenty-five substrates W can be delivered between the in-tank carrier 61 and the pusher 67. When the carrier supporting portions 85 are located at a fourth height position P4, the in-tank carrier 61 having the twenty-five substrates W in the horizontal posture is positioned below the liquid level of the immersion tank 63.

Figure 8A:
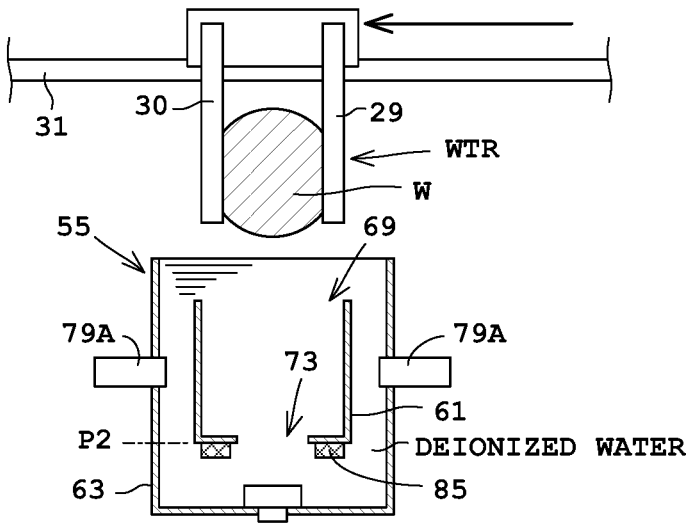
FIGS. 8A to 8C are each a front view illustrating operation of a posture turning unit.
Figure 8B:
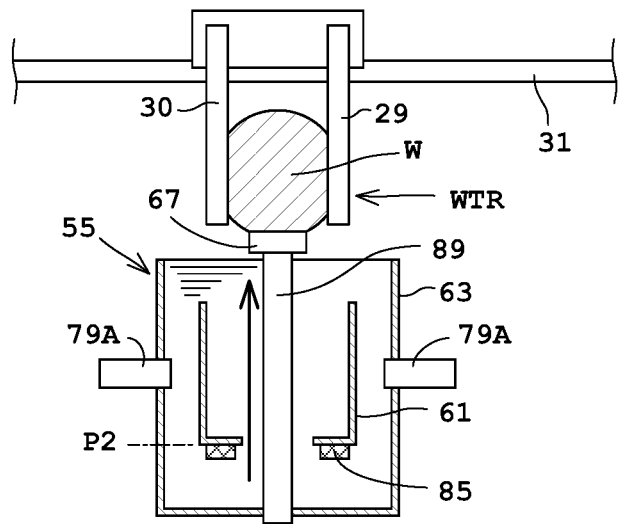

Reference is made to FIG. 8A. The passage 69 of the in-tank carrier 61 of the second posture turning unit 55 is directed upward. The transport mechanism WTR transports the twenty-five substrates W to the above of the in-tank carrier 61. Reference is made to FIG. 8B. Then, the pusher lifting and rotating portion 91 moves the pusher 67 upward to a position where the twenty-five substrates W can be held in a vertical posture. Accordingly, the pusher 67 receives the twenty-five substrates W from the transport mechanism WTR. Here, the pusher 67 moves upward through a gap between the two carrier supporting portions 85, the rear opening 73, and the passage 69 in this order to the twenty-five substrates W.

Figure 8C:
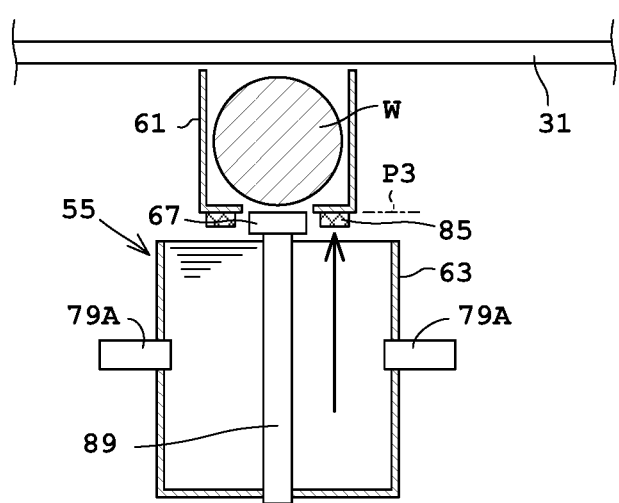

Reference is made to FIG. 8C. Thereafter, the transport mechanism WTR causes the two chucks 29, 30 to open, releases holding of the twenty-five substrates W, and then moves away from the above of the in-tank carrier 61. Thereafter, the carrier lifting and lowering portion 87 moves the carrier supporting portions 85 upward to the third height position P3. Accordingly, the twenty-five substrates W held by the pusher 67 in the vertical posture are accommodated in the in-tank carrier 61.

Figure 9A:
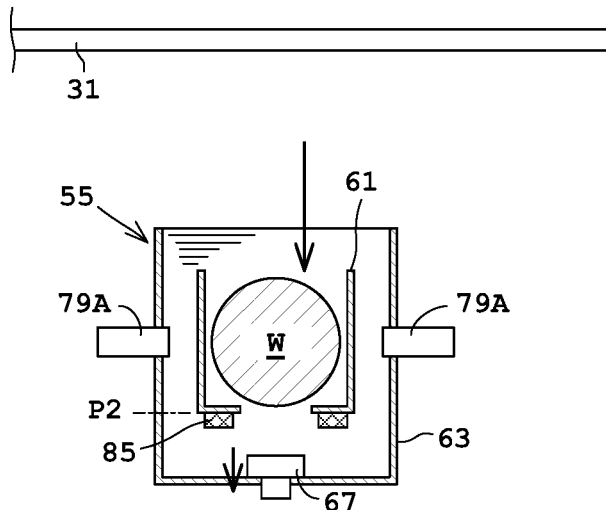
FIGS. 9A to 9C are each a front view illustrating operation of the posture turning unit.
Figure 9B:
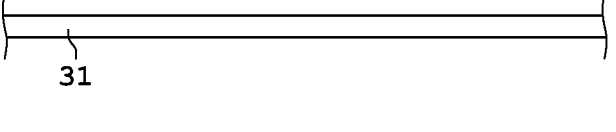
Figure 9B:
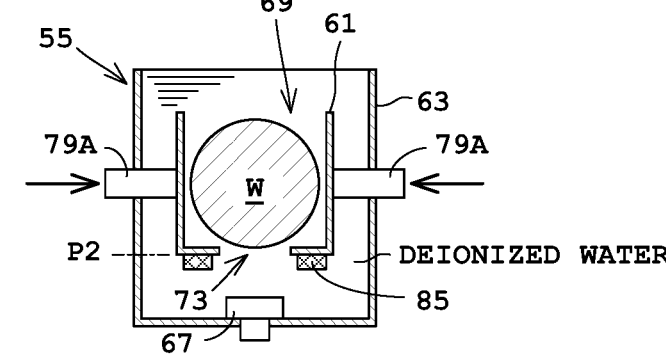

Reference is made to FIG. 9A. Thereafter, the pusher lifting and rotating portion 91 moves the pusher 67 downward to a position near the base of the immersion tank 63. Moreover, the carrier lifting and lowering portion 87 moves the carrier supporting portions 85 downward to the second height position P2. Accordingly, the in-tank carrier 61 accommodating the twenty-five substrates W is immersed in the deionized water within the immersion tank 63. This can prevent drying of the substrates W. Reference is made to FIG. 9B. Thereafter, the two air cylinders 79 of the rotating mechanism 65 cause the two operating shafts 79A to move forward, whereby the in-tank carrier 61 (two side walls 71) is gripped with the two operating shafts 79A (gripping operation).

Figure 9C:
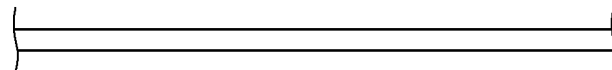
Figure 9C:
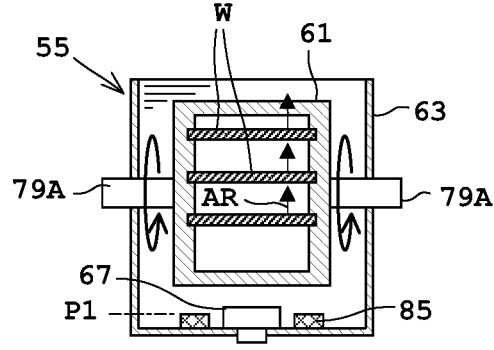

Reference is made to FIG. 9C. Thereafter, the carrier lifting and lowering portion 87 moves the carrier supporting portions 85 downward to the first height position P1. Accordingly, the in-tank carrier 61 is supported only with the two operating shafts 79A. Moreover, the in-tank carrier 61 can rotate vertically. The rotating mechanism 65 rotates the in-tank carrier 61 by 90 degrees around the two operating shafts 79A (horizontal axis). Consequently, a posture of the twenty-five substrates W is turned from vertical to horizontal while the device faces of the substrates W are directed upward. Here, such 90-degree rotation is performed such that the rear opening 73 faces the back plate 83 (see FIG. 5A).

Figure 10:
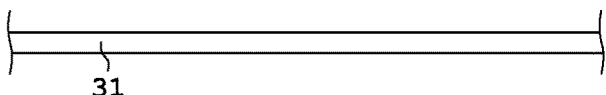
FIG. 10 is a front view illustrating operation of the posture turning unit.
Figure 10:
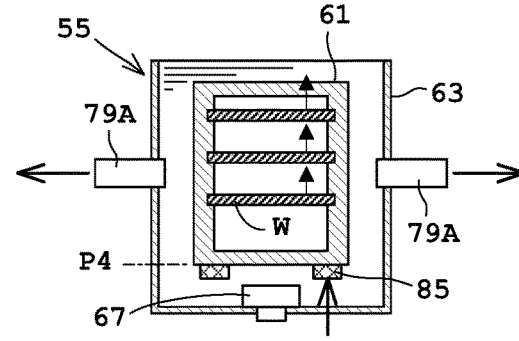

Reference is made to FIG. 10. Thereafter, the carrier lifting and lowering portion 87 moves the carrier supporting portions 85 upward to the fourth height position P4. Thereafter, the two air cylinders 79 of the rotating mechanism 65 cause the two operating shafts 79A to move rearward, whereby gripping of the in-tank carrier 61 with the two operating shafts 79A is released. Accordingly, the in-tank carrier 61 is supported only with the carrier supporting portions 85.

[Step S06] Substrate Transport by Belt Conveyor

Figure 11A:
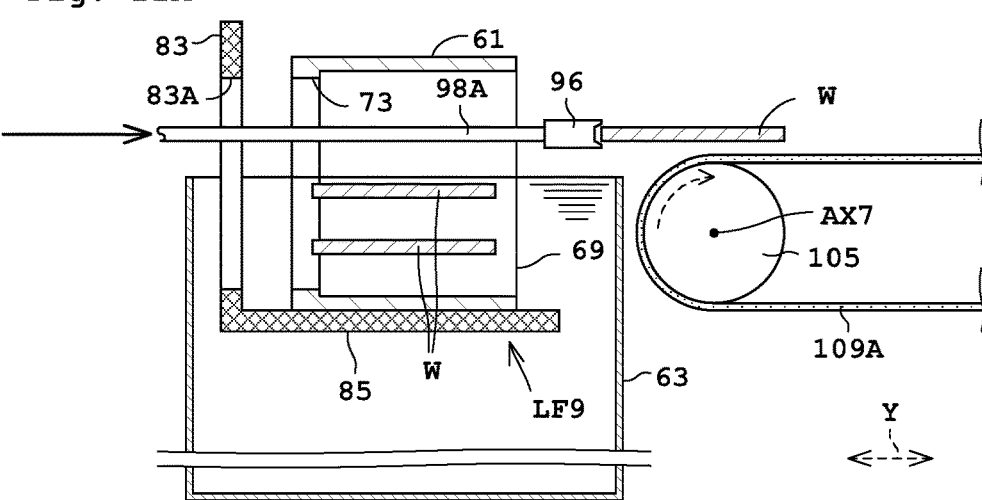
FIGS. 11A and 11B each illustrate operation of unloading substrates from an in-tank carrier.

Thereafter, the second posture turning unit 55 unloads the twenty-five substrates W in the horizontal posture, accommodated in the in-tank carrier 61, in order from the uppermost substrate W. The carrier lifting and lowering portion 87 moves the carrier supporting portions 85 supporting the in-tank carrier 61 upward such that the uppermost substrate W is moved out of the liquid level as shown in FIG. 11A. Here, the substrates W other than the uppermost substrate W are stand-by in the deionized water. Thereafter, the pushing member advancing and withdrawing portion 98 pushes out the uppermost substrate W through the passage 69 while causing the pushing member 96 to move from the back plate opening 83A and the rear opening 73 into the in-tank carrier 61.

Figure 11B:
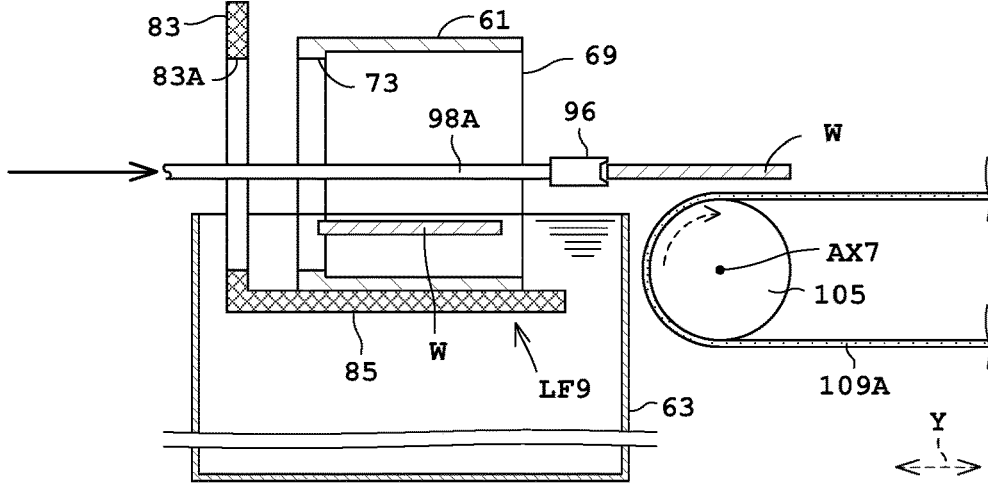

The substrate W pushed out through the passage 69 (called a "first substrate W", where appropriate) is placed on the three belts 109A, 109B, 109C of the belt conveyor 101. Reference is made to FIGS. 6A and 6B. The electric motor 112 of the belt conveyor 101 causes the pulley 105 to rotate, whereby the first substrate W is moved toward the delivery portion 103. The first substrate W passes a predetermined position between the two pulleys 105, 106, the second posture turning unit 55 unloads a second substrate W. The predetermined position is detected by an optical sensor 135, for example. When the optical sensor 135 detects passing of the first substrate W, the carrier lifting and lowering portion 87 moves the carrier supporting portions 85 upward such that an upper substrate W is moved out of the liquid level. Thereafter, as shown in FIG. 11B, the pushing member advancing and withdrawing portion 98 pushes out the second substrate W by the pushing member 96.

The belt conveyor 101 transports the substrate W to the delivery portion 103. Here, the shower heads 59 are arranged along the three belts 109A to 109C of the belt conveyor 101. This can prevent drying of the substrate W while the substrate W is transported by the belt conveyor 101. The belt 109C of the belt conveyor 101 is positioned close to the three lift pins 123, and thus the substrate W can be transported to the above of the three lift pins 123. When the substrate W is transported to the above the three lift pins 123, the lift pin lifting and lowering portion 125 moves the lift pins 123 upward for achieving lifting of the substrate W on the two belts 119, 121. Then, the first center robot CR1 shown in FIG. 1 transports the substrate W, lifted by the three lift pins 123, while holding the substrate W with the first hand 35.

[Step S07] First Single-Wafer Treatment

Reference is made to FIG. 1. The first center robot CR1 transports the substrate W, received from the lift pins 123, to the first single-wafer processing chamber SW1. The first single-wafer processing chamber SW1 supplies deionized water from the nozzle 47 to the device face of the substrate W while the rotating unit 45 rotates the substrate W whose device face is directed upward, for example. Then, the first single-wafer processing chamber SW1 supplies IPA from the nozzle 47 to the device face (top faces) of the substrate W to replace the deionized water on the substrate W with the IPA.

[Step S08] Second Single-Wafer Treatment (Dry Treatment)

Thereafter, the second center robot CR2 takes the substrate W, wetted with the IPA, from first single-wafer processing chamber SW1, and transports the substrate W to the three lift pins 52 of the second single-wafer processing chamber SW2. Thereafter, the three lift pins 52 are moved downward, whereby the substrate W is placed on the supporting tray 49. Thereafter, the supporting tray 49 is moved into the treating space 48A of the chamber body 48.

The second single-wafer processing chamber SW2 performs dry treatment on the substrate W with carbon dioxide under a supercritical state (supercritical fluid). Such dry treatment with the supercritical fluid can suppress collapse of pattern on a pattern face (device face) of the substrate W. After the dry treatment, the supporting tray 49 is taken out of the treating space 48A. Thereafter, the three lift pins 52 are moved upward while passing three holes 49A of the supporting tray 49 to lift the dried substrate W upward.

[Step S09] Substrate Transportation from Buffer Unit to Carrier

The first center robot CR1 transports the substrate W from the three lift pins 52 of the second single-wafer processing chamber SW2 to one of the mount shelves of the buffer unit 33 with use of the second hand 35. When substrates W in one lot (twenty-five) are transported into the buffer unit 33, the substrate handling mechanism HTR collectively transports the twenty-five substrates W from the buffer unit 33 into an empty carrier C placed on the shelf 13A. Then, the transport mechanism 11 in the stocker block 3 transports the carrier C, accommodating the treated substrates W, to the load port 9. An external transport robot, not shown, transports the carrier C in the load port 9 to a next destination. Here, the substrate handling mechanism HTR may return the substrates W one by one from the buffer unit 33 into the carrier C placed on the shelf 13A.

With the embodiment of the present invention, the wet transportation region R5 adjoins the batch treatment region R1 and the single-wafer transportation region R3. The wet transportation region R5 contains the second posture turning unit 55, the belt conveyor mechanism 57, and the shower heads 59. The second posture turning unit 55 is provided on the extension line of the line of the six batch process tanks BT1 to BT6, and turns a posture of the substrates W, on which the immersion treatment is performed, from vertical to horizontal. The belt conveyor mechanism 57 receives the substrates W in the horizontal posture one by one from the second posture turning unit 55, and transports the substrates W to the single-wafer transportation region R3. The shower heads 59 supply a liquid for wetting therewith the substrates W transported by the belt conveyor mechanism 57. The belt conveyor mechanism 57 transports the substrates W, wetted by the shower heads 59, from the second posture turning unit 55 toward the single-wafer transportation region R3. The first center robot CR1 in the single-wafer transportation region R3 receives the substrates W in the horizontal posture, transported by the belt conveyor mechanism 57, and transports the substrates W to the first single-wafer processing chamber SW1. Accordingly, drying the substrates W can be prevented while the substrates W are transported from the batch treatment region R1 to the single-wafer treatment region R4.

Moreover, the belt conveyor mechanism 57 transports the substrates W even when the single-wafer transportation region R3 is apart from the batch treatment region R1, and thus the first center robot CR1 can easily receive the substrates W. In addition, the belt conveyor mechanism 57 and the shower heads 59 can prevent drying of the substrates W. This results in a long transportation path, achieving enhanced flexibility in arrangement of the batch treatment region R1 and the single-wafer treatment region R4.

Moreover, the single-wafer transportation region R3 is provided between the batch treatment region R1 and the single-wafer treatment region R4. Accordingly, the transferring block 5, the batch treatment region R1, and the single-wafer treatment region R4 can be arranged around the single-wafer transportation region R3 as the center.

Moreover, the single-wafer treatment region R4 contains the first single-wafer processing chamber SW1 and the second single-wafer processing chamber SW2, and further contains the second center robot CR2 for transporting the substrates W between the first single-wafer processing chamber SW1 and the second single-wafer processing chamber SW2. The first center robot CR1 receives the substrates W in the horizontal posture, transported by the belt conveyor mechanism 57, and transports the substrates W to the first single-wafer processing chamber SW1, and unloads the substrates W treated in the second single-wafer processing chamber SW2. Accordingly, the substrates W are transported by the two center robots CR1 and CR2, achieving enhanced throughput.

The second posture turning unit 55 includes the immersion tank 63 where the in-tank carrier 61 can be immersed in the deionized water. This can prevent drying of the substrates W accommodated in the in-tank carrier 61. Moreover, the pushing member advancing and withdrawing portion 98 can push out the substrates W, accommodated in the in-tank carrier 61, with the pushing member 96. Accordingly, the substrates W can be taken out of the in-tank carrier 61 without moving the hands 35 of the first center robot CR1 forward.

Second Embodiment

Figure 12:
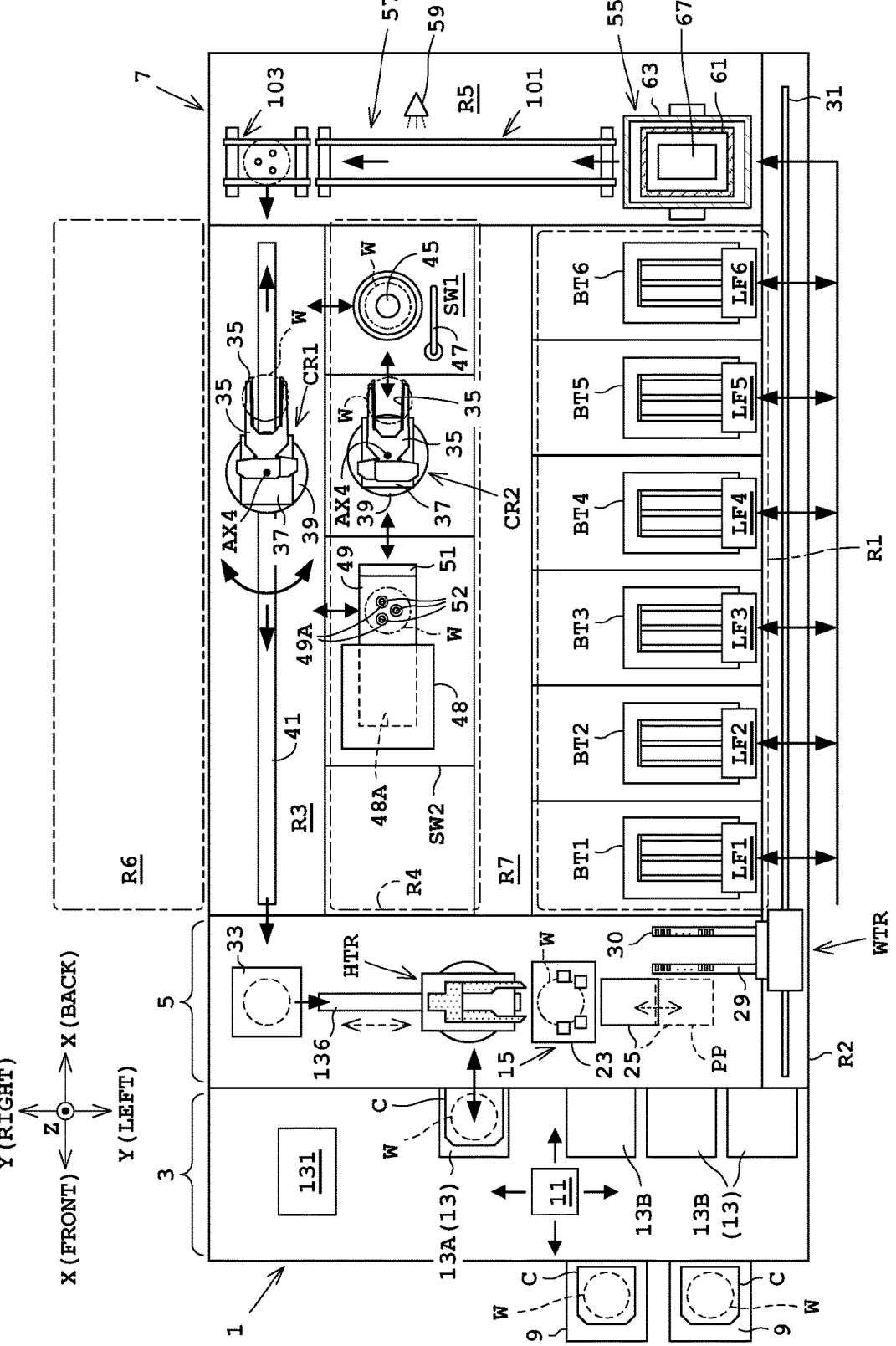
FIG. 12 is a plan view schematically illustrating a configuration of a substrate treating apparatus according to a second embodiment of the present invention.

The following describes a second embodiment of the present invention with reference to the drawings. Here, the description common to that of the first embodiment is to be omitted. FIG. 12 is a plan view schematically illustrating a configuration of a substrate treating apparatus 1 according to a second embodiment of the present invention.

In the first embodiment, the single-wafer transportation single-wafer transportation region R3 is provided between the batch treatment region R1 and the single-wafer treatment region R4 as shown in FIG. 1. In this regard, in the second embodiment, the single-wafer treatment region R4 is provided between the batch treatment region R1 and the single-wafer transportation region R3 as shown in FIG. 12.

That is, the batch treatment region R1, the single-wafer treatment region R4, and the single-wafer transportation region R3 are arranged rightward Y in this order. Accordingly, a second single-wafer treatment region R6 can be arranged rightward of the single-wafer transportation region R3 in FIG. 12. Accordingly, a region opposite to the single-wafer treatment region R4 across the single-wafer transportation region R3 is usable as the second single-wafer treatment region R6, achieving arrangement of many single-wafer processing chambers. Moreover, a region R7 is present between the batch treatment region R1 and the single-wafer treatment region R4 for maintenance, but the region R7 is not necessarily present. Moreover, the transferring block 5 includes the buffer unit 33. The substrate handling mechanism HTR can move in the transverse direction Y along a rail 136.

Moreover, in the substrate treating apparatus 1 shown in FIG. 12, the belt conveyor mechanism 57 transports the substrates W from the second posture turning unit 55 to the single-wafer transportation region R3 linearly. In this regard, the belt conveyor mechanism 57 may be provided so as to avoid an obstacle in plan view when it cannot transport the substrates W linearly. Accordingly, since the belt conveyor mechanism 57 can transport the substrates W while avoiding the obstacle, achieving enhanced flexibility in arrangement of the single-wafer treatment region R4 and the like.

Figure 13:
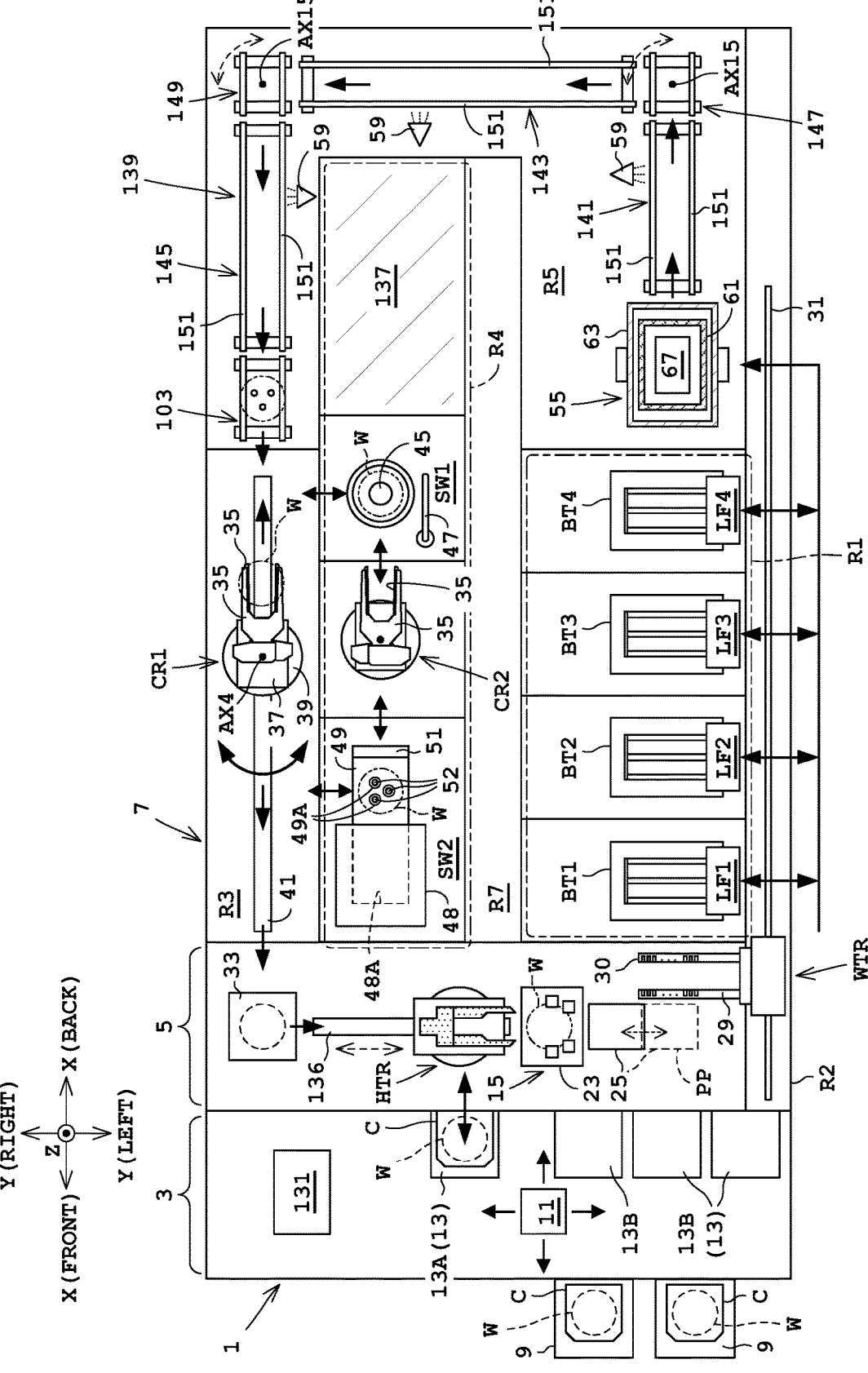
FIG. 13 is a plan view schematically illustrating a configuration of a substrate treating apparatus according to one modification of the second embodiment of the present invention.

Reference is made to FIG. 13. There is a case where the single-wafer treatment region R4 contains a side cabinet 137, for example, rearward X of the two single-wafer processing chambers SW1, SW2. The side cabinet 137 is provided with at least one selected from a bottle for supplying chemical, a chemical pipe, a deionized water pipe, and an exhaust duct, for example. In this case, since the side cabinet 137 in the single-wafer treatment region R4 is interposed, the belt conveyor mechanism 57 cannot transport the substrates W linearly from the second posture turning unit 55 to the single-wafer transportation region R3. The obstacle is not limited to the side cabinet 137, but may be the single-wafer processing chamber, for example.

Here, the belt conveyor mechanism 139 includes three (n) belt conveyors 141, 143, 145, and two (n–1) direction changing units 147, 149, for example. Here, the numeral "n" denotes a natural number larger than one. The second posture turning unit 55 is directed rearward X. That is, the pushing member advancing and withdrawing portion 98 moves the pushing member 96 forward and rearward in the front-back direction X.

A first belt conveyor 141 is provided rearward X of the second posture turning unit 55. A first direction changing unit 147 is provided rearward X of the first belt conveyor 141. A second belt conveyor 143 is provided rightward Y of the first direction changing unit 147. A second direction changing unit 149 is provided rightward Y of the second belt conveyor 143. A third belt conveyor 145 is provided forward X of the second direction changing unit 149. The delivery portion 103 (see FIG. 6B) is provided forward X of the third belt conveyor 145.

Figure 14A:
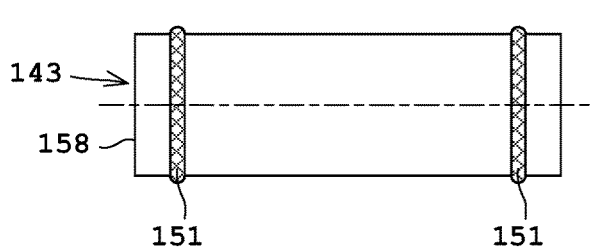
FIGS. 14A and 14B are each a side view illustrating operation of a direction changing unit of the belt conveyor mechanism.
Figure 14A:
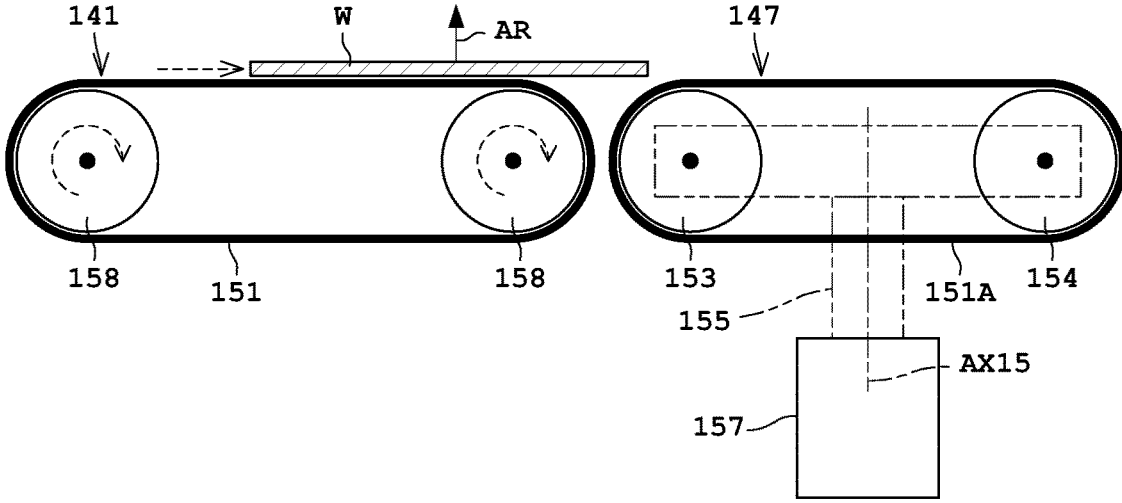

The three belt conveyors 141, 143, 145, and the two direction changing units 147, 149 each include an electric motor for driving a belt 151 (151A). Moreover, the first direction changing unit 147 changes a transport direction of the substrates W for transporting the substrates W between the two belt conveyors 141, 143 whose transportation directions are different from each other. As shown in FIG. 14A, the first direction changing unit 147 includes two pulleys 153, 154, two belts 151A wound on the pulleys 153, 154, a supporting member 155 supporting the two pulleys 153, 154 rotatably, and a lifting and rotating portion 157. The lifting and rotating portion 157 moves the supporting member 155 upward and downward, and rotates the supporting member 155 around a vertical axis AX15. Here, the second direction changing unit 149 is configured in the same manner as the first direction changing unit 147. The lifting and rotating portion 157 includes a plurality of electric motors, for example.

Figure 14B:
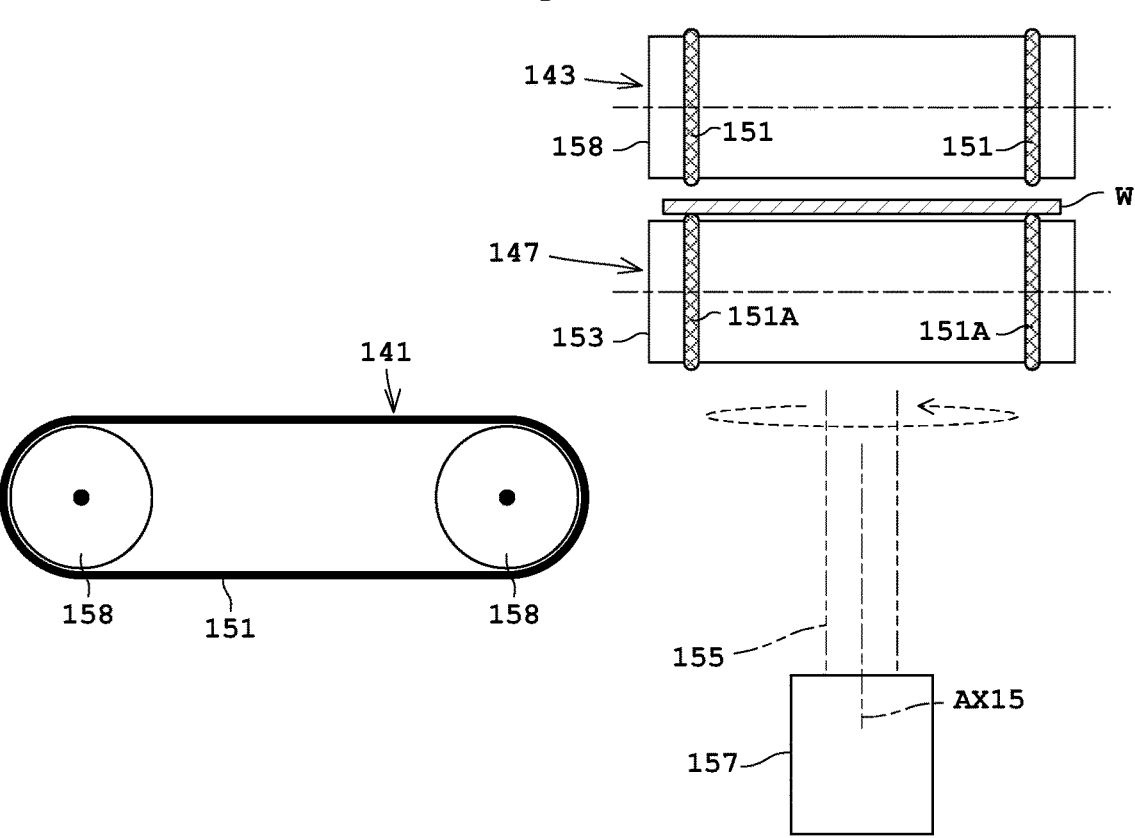

Here in FIGS. 14A and 14B, the two belt conveyors 141, 143 each include pulleys 158. The third belt conveyor 145 (FIG. 13) also includes the pulleys 158. As shown in FIG. 14A, the second belt conveyor 143 is positioned higher than the first belt conveyor 141, for example. Moreover, the third belt conveyor 145 is positioned lower than the second belt conveyor 143. The third belt conveyor 145 may be positioned higher than the second belt conveyor 143.

Description is now made of operation of the first direction changing unit 147. Reference is made to FIG. 14A. The first belt conveyor 141 transports a substrate W to the first direction changing unit 147. As shown in FIG. 14B, the first direction changing unit 147 rotates the two pulleys 153, 154, the supporting member 155, and the like around the vertical axis AX15 at a level where they do not interfere with the two belt conveyors 141, 143. Thereafter, the first direction changing unit 147 moves the two pulleys 153, 154 upward to a level same as that of the second belt conveyor 143 (pulleys 158). Thereafter, the first direction changing unit 147 drives the belt 151A with the electric motor, whereby the substrates W are transported to the second belt conveyor 143.

The following describes operation in belt conveyor mechanism 139. The pusher 67 of the second posture turning unit 55 receives the twenty-five substrates W, aligned in the transverse direction Y, by the transport mechanism WTR. Thereafter, the pusher lifting and rotating portion 91 rotates the pusher 67 by 90 degrees around the vertical axis AX5. Accordingly, the twenty-five substrates W are aligned in the front-back direction X. The second posture turning unit 55 turns a posture of the twenty-five substrates W, aligned in the front-back direction X, from vertical to horizontal in the deionized water stored in the immersion tank 63.

Thereafter, the second posture turning unit 55 causes the pushing member 96 to push a substrate W to the first belt conveyor 141. The first belt conveyor 141 transports the substrate W to the first direction changing unit 147. The first direction changing unit 147 changes a transportation direction of the substrate W while moving the substrate W upward to transport the substrate W to the second belt conveyor 143. The second belt conveyor 143 transports the substrate W to the second direction changing unit 149. The second direction changing unit 149 changes a transportation direction of the substrate W while moving the substrate W downward to transport the substrate W to the third belt conveyor 145. The third belt conveyor 145 transports the substrate W to the delivery portion 103. The delivery portion 103 lifts the substrate W with the three lift pins 123. Then, the first center robot CR1 holds the substrates W, lifted by the three lift pins 123, with use of the first hand 35, and thereafter, transports the substrate W to the first single-wafer processing chamber SW1.

The shower heads 59 are provided along the belts 151 of the three belt conveyors 141, 143, 145. The shower heads 59 supply deionized water in a shower state to substrates W being transported. This can prevent drying of the substrates W in the belt conveyor mechanism 139. Here, the shower heads 59 may be provided in the direction changing units 147, 149.

Third Embodiment

Figure 15:
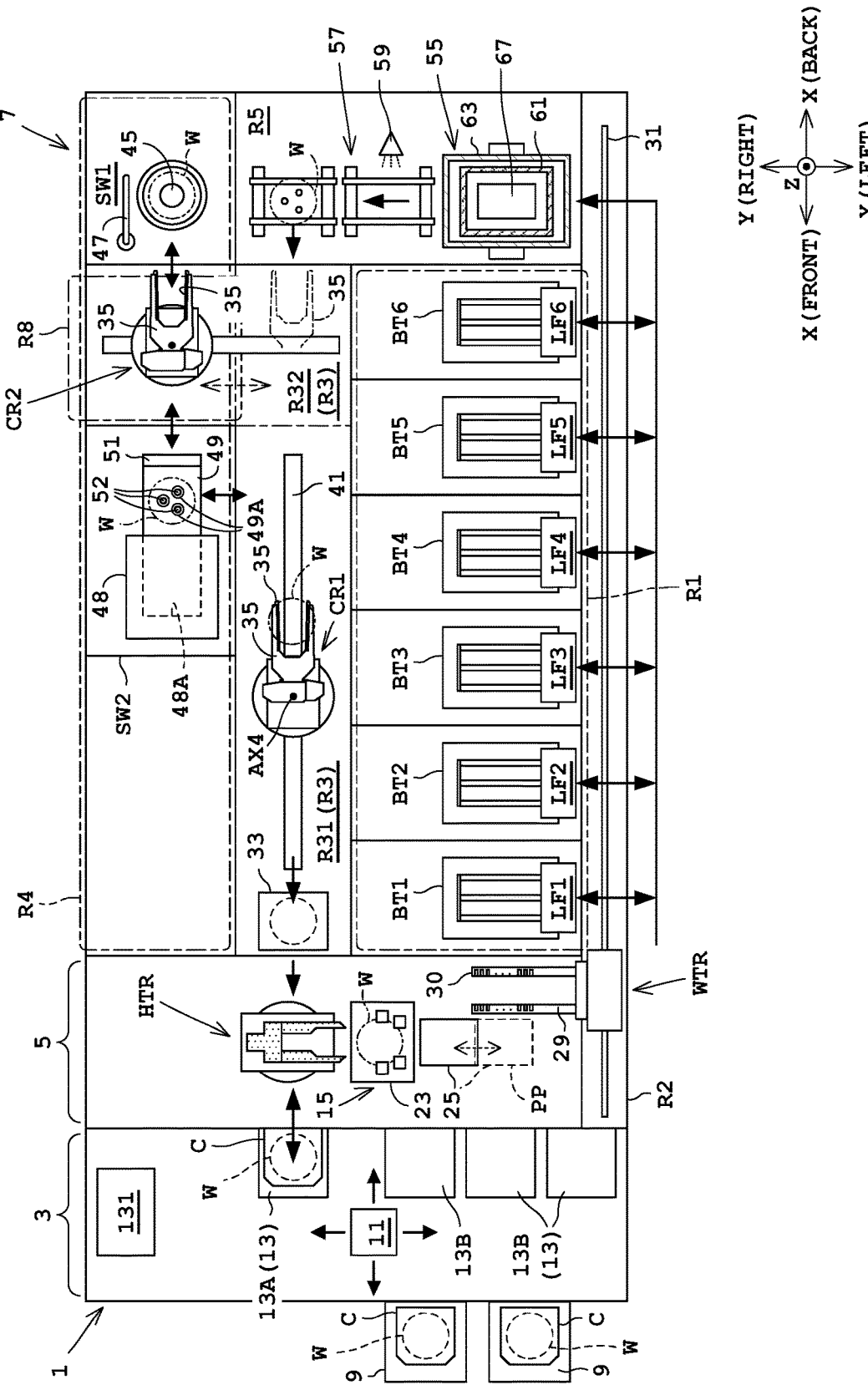
FIG. 15 is a plan view schematically illustrating a configuration of a substrate treating apparatus according to a third embodiment of the present invention.

The following describes a third embodiment of the present invention with reference to the drawings. Here, the description common to that of the first and second embodiments is to be omitted. FIG. 15 is a plan view schematically illustrating a configuration of a substrate treating apparatus 1 according to a third embodiment of the present invention.

In the first embodiment, the first center robot CR1 transports substrates W from the belt conveyor mechanism 57 to the first single-wafer processing chamber SW1, and from the second single-wafer processing chamber SW2 to the buffer unit 33. Moreover, the second center robot CR2 transports substrates W from the first single-wafer processing chamber SW1 to the second single-wafer processing chamber SW2. In this regard, in the third embodiment, the first center robot CR1 transports substrates W from the second single-wafer processing chamber SW2 to the buffer unit 33. Moreover, the second center robot CR2 transports substrates W from the belt conveyor mechanism 57 to the first single-wafer processing chamber SW1, and from the first single-wafer processing chamber SW1 to the second single-wafer processing chamber SW2.

The single-wafer treatment region R4 contains the two single-wafer processing chambers SW1, SW2, and further contains a second single-wafer transportation region R8 between the both single-wafer processing chambers SW1 and SW2. The wet transportation region R5 is provided on a first end of the batch treatment region R1 opposite to the transferring block 5. The single-wafer transportation region R3 contains a transferring block-side transportation region R31 adjacent to the transferring block 5 and a belt conveyor-side transportation region R32 adjacent to the belt conveyor mechanism 57.

The transferring block-side transportation region R31 contains the first center robot CR1. The first center robot CR1 unloads substrates W treated in the second single-wafer processing chamber SW2. That is, the first center robot CR1 unloads the substrates W, treated in the second single-wafer processing chamber SW2, to the buffer unit 33. The second single-wafer transportation region R8 and the belt conveyor-side transportation region R32 contain the second center robot CR2. The second center robot CR2 receives substrates W in a horizontal posture, transported by the belt conveyor mechanism 57, and transports the substrates W to the first single-wafer processing chamber SW1. Moreover, the second center robot CR2 transports the substrates W, treated in the first single-wafer processing chamber SW1, to the second single-wafer processing chamber SW2. The second center robot CR2 is movable in the transverse direction Y between the second single-wafer transportation region R8 and the belt conveyor-side transportation region R32.

With this embodiment, the first center robot CR1 can transport only the dried substrates W, and the second center robot CR2 can transport only the wet substrates W.

Fourth Embodiment

Figure 16:
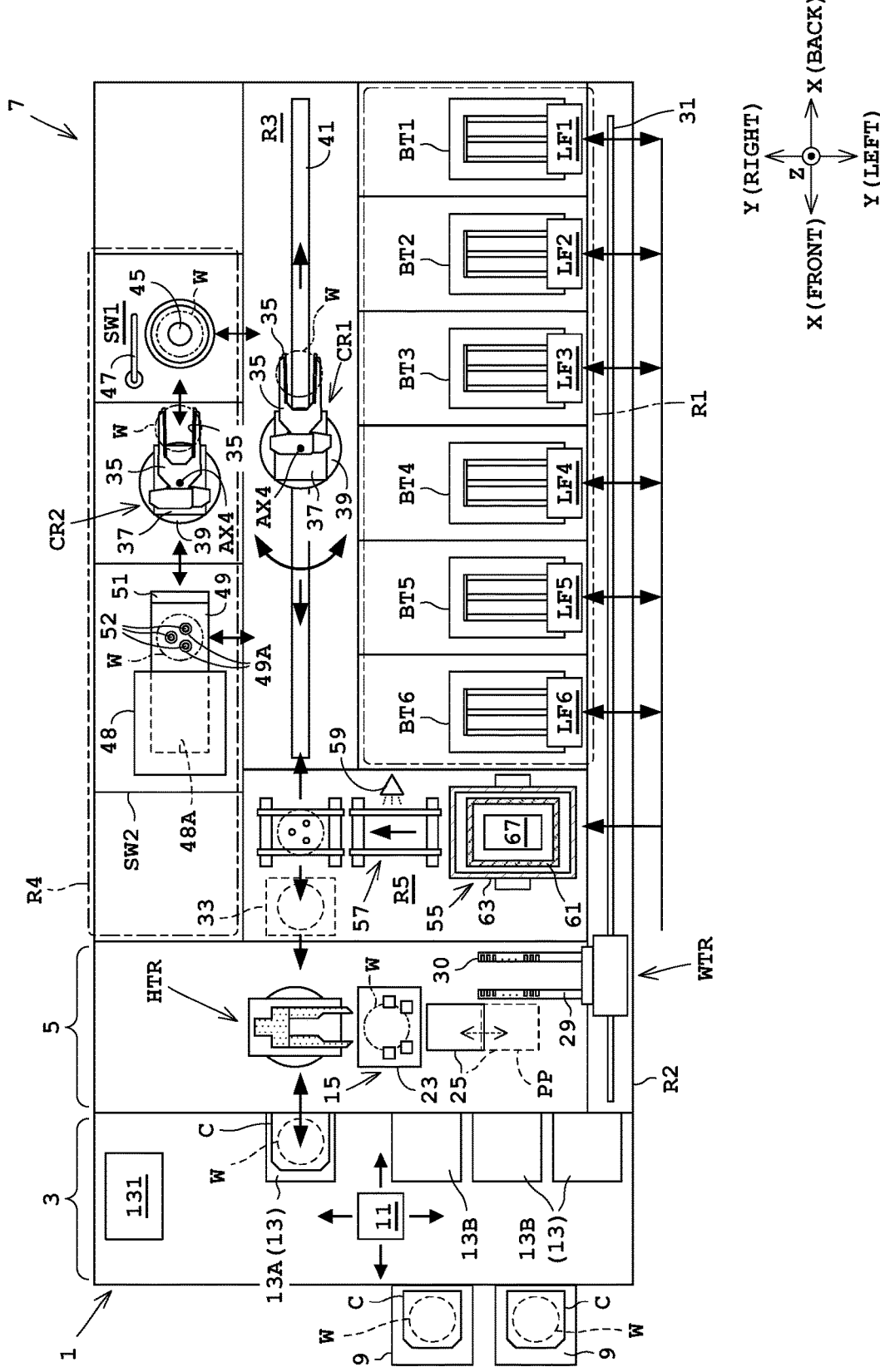
FIG. 16 is a plan view schematically illustrating a configuration of a substrate treating apparatus according to a fourth embodiment of the present invention.

A fourth embodiment of the present invention will now be described with reference to the drawings. Here, the description common to that of the first to third embodiments is to be omitted. FIG. 16 is a plan view schematically illustrating a configuration of a substrate treating apparatus 1 according to a fourth embodiment of the present invention.

In the first embodiment, the wet transportation region R5 is provided on a first end of the batch treatment region R1 opposite to the transferring block 5. In this regard, in the fourth embodiment, the wet transportation region R5 is provided between the transferring block 5 and the batch treatment region R1.

With this embodiment, the wet transportation region R5 is arranged adjacent to the transferring block 5. As a result, the first center robot CR1 can be transport substrates W starting from a side adjacent to the transferring block 5. In addition, since the chemical liquid process tanks BT1 to BT4 can be positioned apart from the transferring block 5, achieving suppression of adverse effects like corrosion of mechanisms, like the substrate handling mechanism HTR of the transferring block 5, by chemical atmosphere.

Moreover, the wet transportation region R5 may be provided between the two batch process tanks BT3, BT4 in the batch treatment region R1, for example. As a result, substrates W can be transported starting from a middle position in a line of the six batch process tanks BT1 to BT6.

The present invention is not limited to the foregoing examples, but may be modified as follows.

Figure 17:
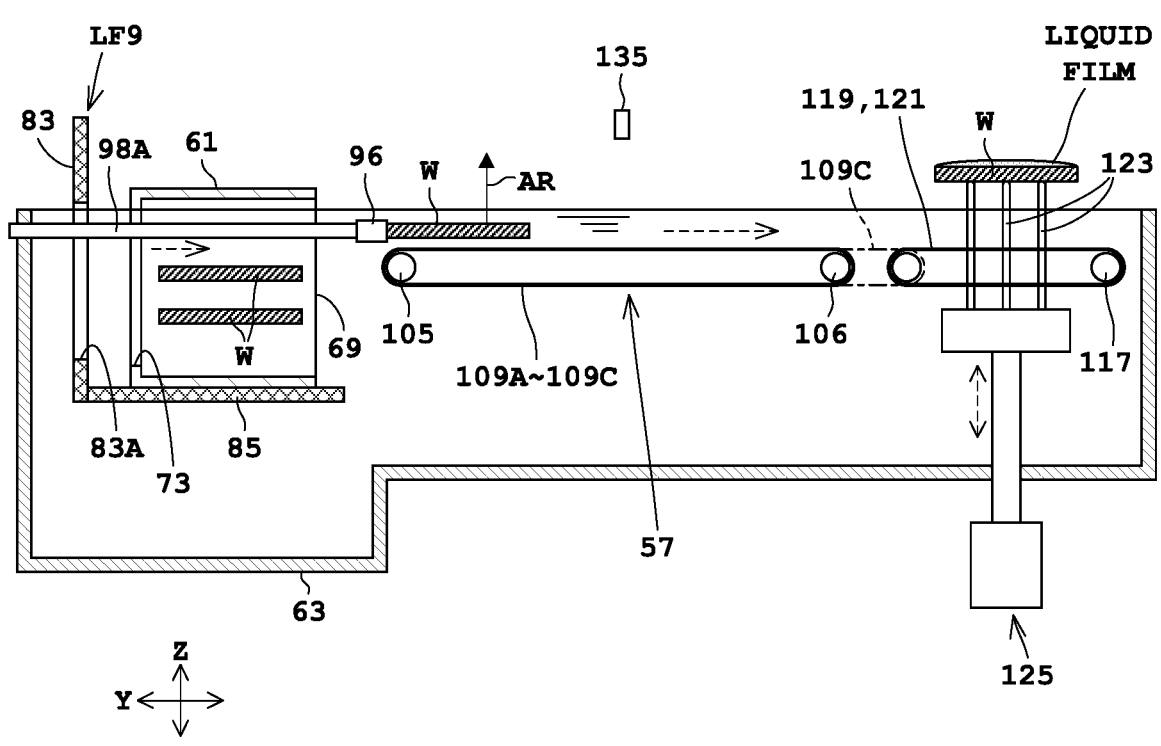
FIG. 17 is a side view of a belt conveyor mechanism according to one modification.

(1) In the embodiments described above, the belt conveyor mechanism 57 (139) has the shower heads 59 for preventing drying of the substrates W in transportation. In this regard, as shown in FIG. 17, for example, the belt conveyor mechanism 57 (139) may transport the substrates W in deionized water stored in the immersion tank 63. In this case, the jet pipes 77 correspond to the liquid supplying unit in the present invention, for example. Moreover, the shower heads 59 serving as the liquid supplying unit supply deionized water in a shower state to the substrates W. In this regard, the liquid supplying unit may supply deionized water in a mist state to the substrates W.

(2) In the embodiments and the modification (1) described above, the treating block 7 includes the second center robot CR2 in addition to the first center robot CR1. In this regard, the treating block 7 is not necessarily provided with the second center robot CR2, where appropriate. In this case, the first center robot CR1 transports the substrates W from the first single-wafer processing chamber SW1 to the second single-wafer processing chamber SW2.

(3) In the embodiments and the modifications described above, the batch process tanks BT1 to BT6 each perform treatment on twenty-five substrates W aligned in a face-to-back system at a full pitch (e.g., 10 mm). The face-to-back system is an alignment manner where device faces of all the substrates W face in the same direction. In this regard, the batch process tanks BT1 to BT6 may each perform treatment on fifty substrates W aligned at a half pitch (e.g., 5 mm) as half the full pitch.

Moreover, the pushing member 96 shown in FIG. 5A pushes out the substrate W horizontally while contacting the edge of the substrate W in the horizontal direction. Accordingly, even when the fifty substrates W are aligned at a half pitch in the face-to-back system, one substrate W can be taken by the pushing member 96 without increasing a pitch between two adjacent substrates W.

Moreover, the batch process tanks BT1 to BT6 may each perform treatment on the fifty substrates W aligned in a face-to-face system. The face-to-face system is an alignment manner where two device faces (or two back faces) of two adjacent substrates W face each other. In this case, the batch substrate transportation region R2 contains, in addition to the transport mechanism WTR for transporting fifty substrates W aligned at a half pitch, a second transport mechanism for pulling out twenty-five substrates W, aligned every other substrate W, from fifty substrates W aligned at a half pitch. The second transport mechanism transports twenty-five substrates W from the lifter LF5 of the water cleaning process tank BT5 to the pusher 67, for example.

(4) In the embodiments and the modifications described above, the single-wafer processing chamber SW2 performs the dry treatment on the substrates W with the supercritical fluid. In this regard, the single-wafer processing chamber SW2 may include a rotating unit 45 and a nozzle 47 like the single-wafer processing chamber SW1. In this case, the single-wafer processing chambers SW1, SW2 each supply deionized water and IPA to the substrates W in this order, for example, and then perform dry treatment (spin drying) on the substrates W.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for successively performing batch treatment for processing a plurality of substrates collectively and single-wafer treatment for processing the substrates one by one, the substrate treating apparatus comprising:

a carrier mount shelf configured to place a carrier thereon, the carrier accommodating a plurality of substrates in a horizontal posture vertically at a predetermined gap;

a transferring block adjoining the carrier mount shelf; and a treating block adjoining the transferring block, the transferring block including:

a first posture turning mechanism configured to turn a posture of the substrates, taken out of the carrier, from horizontal to vertical; and a substrate handling mechanism configured to take out the substrates collectively from the carrier placed on the carrier mount shelf to transport the substrates to the first posture turning mechanism, and configured to return the substrates, on which the single-wafer treatment is performed, to the carrier placed on the carrier mount shelf, the treating block including:

a batch treatment region extending in a direction apart from the transferring block;

a batch substrate transportation region which is provided along the batch treatment region, whose first end extends to the transferring block, and whose second end extends in a direction apart from the transferring block;

a single-wafer transportation region extending in a direction apart from the transferring block;

a single-wafer treatment region provided along the single-wafer transportation region; and a wet transportation region adjoining the batch treatment region and the single-wafer transportation region, the batch treatment region containing a plurality of batch process tanks configured to perform immersion treatment on the substrates collectively and arranged in a direction where the batch treatment region extends, the wet transportation region containing a second posture turning mechanism provided on an extension line of a line of the batch process tanks and configured to turn a posture of the substrates, on which the immersion treatment is performed, from vertical to horizontal, a belt conveyor mechanism configured to receive the substrates in a horizontal posture one by one from the second posture turning mechanism and transport the substrates to the single-wafer transportation region, and a liquid supplying unit configured to supply a liquid to wet the substrates, transported by the belt conveyor mechanism, with the liquid, the single-wafer treatment region containing a plurality of single-wafer processing chambers, configured to perform treatment on the substrates one by one, arranged in a direction where the single-wafer treatment region extends, the single-wafer transportation region containing a single-wafer substrate transport mechanism that can receive the substrates in the horizontal posture, transported by the belt conveyor mechanism and transport the substrates to the single-wafer processing chamber, and can unload the substrates on which the treatment is performed in the single-wafer processing chamber, and the batch substrate transportation region containing a batch substrate transport mechanism configured to transport the substrates collectively among a substrate delivery position defined in the transferring block, the batch process tanks, and the second posture turning mechanism.

2. The substrate treating apparatus according to claim 1, wherein the single-wafer transport region is provided between the batch treatment region and the single-wafer treatment region.

3. The substrate treating apparatus according to claim 2, wherein the single-wafer treatment region contains a first single-wafer processing chamber and a second single-wafer processing chamber as the plurality of single-wafer processing chambers, and further contains a second single-wafer substrate transport mechanism configured to transport the substrates between both the chambers, and the single-wafer substrate transport mechanism receives the substrates in the horizontal posture, transported by the belt conveyor mechanism, to transport the substrates to the first single-wafer processing chamber, and unloads the substrates on which the treatment is performed in the second single-wafer processing chamber.

4. The substrate treating apparatus according to claim 1, wherein the single-wafer treatment region is provided between the batch treatment region and the single-wafer transportation region.

5. The substrate treating apparatus according to claim 4, the wet transportation region is provided on a first end of the batch treatment region opposite to the transferring block, and when the substrates cannot be transported linearly from the second posture turning mechanism to the single-wafer transportation region because the single-wafer treatment region is interposed, the belt conveyor mechanism is provided so as to avoid the single-wafer treatment region in plan view.

6. The substrate treating apparatus according to claim 1, wherein the wet transportation region is provided between the transferring block and the batch treatment region.

7. The substrate treating apparatus according to claim 1, wherein the single-wafer treatment region contains a first single-wafer processing chamber and a second single-wafer processing chamber as the plurality of single-wafer processing chambers and further contains a second single-wafer transportation region between both the chambers, the wet transportation region is provided on a first end of the batch treatment region opposite to the transferring block, the single-wafer transportation region contains a transferring block-side transportation region adjacent to the transferring block and a belt conveyor-side transportation region adjacent to the belt conveyor mechanism, the second single-wafer transportation region and the belt conveyor-side transportation region contain a second single-wafer substrate transport mechanism configured to receive the substrates in the horizontal posture, transported by the belt conveyor mechanism, and transport the substrates to the first single-wafer processing chamber, and configured to unload the substrates on which a treatment is performed in the first single-wafer processing chamber to the second single-wafer processing chamber, and the single-wafer substrate transport mechanism unloads the substrates on which a treatment is performed in the second single-wafer processing chamber.

8. The substrate treating apparatus according to claim 1, wherein the second posture turning mechanism includes:

an in-tank carrier having a passage through which the substrates are loaded and unloaded, two side walls including plural-paired holding grooves for housing the substrates having passed through the passage, the holding grooves being provided such that grooves in each pair face each other, and a rear opening which is provided so as to face the passage across the substrates and whose width is smaller than a diameter of each of the substrates in a radial direction, an immersion tank configured to store an immersion liquid for immersing the in-tank carrier in the immersion liquid, a carrier supporting portion configured to support the in-tank carrier from below, a carrier lifting and lowering portion configured to move the carrier supporting portion upward and downward, a rotating mechanism configured to rotate the in-tank carrier around two rotation shafts extending in a horizontal direction while gripping the two side walls of the in-tank carrier with the two rotation shafts in order to turn a posture of the substrates from vertical to horizontal, a pushing member configured to push out one substrate accommodated in the in-tank carrier, and a pushing member advancing and withdrawing portion configured to move the pushing member forward and rearward in a horizontal direction, wherein when the substrates accommodated in the in-tank carrier are in the horizontal posture, the pushing member advancing and withdrawing portion pushes out the one substrate through the passage while moving the pushing member forward from the rear opening into the in-tank carrier.

* * * * *